(12) United States Patent
Chen et al.

(10) Patent No.: US 10,811,835 B2
(45) Date of Patent: Oct. 20, 2020

(54) LASER SYSTEM ENABLED BY ADDITIVE MANUFACTURING

(71) Applicant: University of Pittsburgh—Of the Commonwealth System of Higher Education, Pittsburgh, PA (US)

(72) Inventors: Peng Kevin Chen, Washington, PA (US); Shuo Li, Pittsburgh, PA (US); Albert Chi Fu To, Pittsburgh, PA (US)

(73) Assignee: University of Pittsburgh-Of the Commonwealth System of Higher Education, Pittsburgh, PA (US)

( * ) Notice: Subject to any disclaimer, the term of this patent is extended or adjusted under 35 U.S.C. 154(b) by 0 days.

(21) Appl. No.: 15/897,490

(22) Filed: Feb. 15, 2018

(65) Prior Publication Data
US 2018/0233873 A1 Aug. 16, 2018

Related U.S. Application Data

(60) Provisional application No. 62/459,804, filed on Feb. 16, 2017.

(51) Int. Cl.
*H01S 3/02* (2006.01)
*H01S 3/06* (2006.01)
(Continued)

(52) U.S. Cl.
CPC ............ *H01S 3/025* (2013.01); *B22F 3/1055* (2013.01); *B22F 5/10* (2013.01); *B33Y 10/00* (2014.12); *B33Y 80/00* (2014.12); *G02B 7/004* (2013.01); *G02B 7/008* (2013.01); *H01S 3/042* (2013.01); *H01S 3/0407* (2013.01); *H01S 3/061* (2013.01); *H01S 3/11* (2013.01); *B22F 2999/00* (2013.01);
(Continued)

(58) Field of Classification Search
CPC .... H01S 3/025; H01S 3/042; H01S 3/094038; H01S 3/0941; H01S 3/09415; B22F 5/10; G02B 7/008
See application file for complete search history.

(56) References Cited

U.S. PATENT DOCUMENTS 4,731,795 A * 3/1988 Clark ...................... H01S 3/025
372/101
4,756,003 A 7/1988 Baer et al.
(Continued)

OTHER PUBLICATIONS

Goldberg et al., VSCEL end-pumped passively Q-switched Nd:YAG laser with adjustable pulse energy, Optics Express, Feb. 28, 2011/vol. 19, No. 5, (C) 2011 OSA.

*Primary Examiner* — Michael Carter
(74) *Attorney, Agent, or Firm* — Eckert Seamans Cherin & Mellott, LLC; Philip E. Levy

(57) ABSTRACT

A laser frame for holding a plurality of optical components includes a first flexure structure for adjustably holding a first one of the optical components, and a first cellular structure for supporting and cooling a second one of the optical components. The first flexure structure and the first cellular structure are each a unitary structure formed by additive manufacturing. Also, a laser frame for holding an optical component includes a passive cooling cellular structure for supporting and cooling the optical component. The passive cooling cellular structure has a non-uniform density, and the laser frame is a unitary structure formed by additive manufacturing.

15 Claims, 21 Drawing Sheets

(51) Int. Cl.
*H01S 3/042* (2006.01)
*B33Y 10/00* (2015.01)
*H01S 3/04* (2006.01)
*H01S 3/11* (2006.01)
*B33Y 80/00* (2015.01)
*B22F 3/105* (2006.01)
*B22F 5/10* (2006.01)
*G02B 7/00* (2006.01)
*H01S 3/16* (2006.01)
*H01S 3/094* (2006.01)
*G02B 7/182* (2006.01)
*H01S 5/183* (2006.01)
*H01S 3/113* (2006.01)

(52) U.S. Cl.
CPC ............ *G02B 7/182* (2013.01); *H01S 3/0621* (2013.01); *H01S 3/0623* (2013.01); *H01S 3/094038* (2013.01); *H01S 3/113* (2013.01); *H01S 3/1611* (2013.01); *H01S 3/1643* (2013.01); *H01S 5/183* (2013.01)

(56) References Cited

U.S. PATENT DOCUMENTS

| | | |
|---|---|---|
| 4,910,746 A | 3/1990 | Nicholson |
| 5,140,607 A | 8/1992 | Paiva |
| 5,369,661 A | 11/1994 | Yamaguchi et al. |
| 5,440,574 A * | 8/1995 | Sobottke ................ H01S 3/025 372/101 |
| 5,572,541 A | 11/1996 | Suni |
| 5,802,914 A | 9/1998 | Fassler et al. |
| 5,949,805 A | 9/1999 | Mordaunt et al. |
| 6,016,230 A | 1/2000 | Nunnally et al. |
| 6,498,892 B1 | 12/2002 | Harman |
| 7,039,081 B2 | 5/2006 | Stingl et al. |
| 2003/0035229 A1 * | 2/2003 | Willis ................... G02B 7/004 359/819 |
| 2006/0245460 A1 | 11/2006 | Luo et al. |
| 2007/0238219 A1 | 10/2007 | Bennett et al. |
| 2007/0297469 A1 | 12/2007 | Brown |
| 2009/0016385 A1 | 1/2009 | Sakai et al. |
| 2013/0208753 A1 | 8/2013 | Van Leeuwen et al. |
| 2017/0277168 A1 * | 9/2017 | Tanaka ............... G05B 19/4099 |

\* cited by examiner

LASER SYSTEM ENABLED BY ADDITIVE MANUFACTURING

CROSS-REFERENCE TO RELATED APPLICATIONS

This application claims priority under 35 U.S.C. § 119(e) from U.S. provisional patent application No. 62/459,804, entitled "Laser System Enabled by Additive Manufacturing" and filed on Feb. 16, 2017, the contents of which are incorporated herein by reference.

GOVERNMENT CONTRACT

This invention was made with government support under grant # HDTRA1-12-1-0019 awarded to the Defense Threat Reduction Agency (DTRA). The government has certain rights in the invention.

BACKGROUND OF THE INVENTION

1. Field of the Invention

The present invention relates to lasers, and, in particular, to a laser system, such as, without limitation, a Q-switched laser system, that is made by additive manufacturing techniques.

2. Description of the Related Art

For a typical laser system, many discrete mechanical mounts and stages are bolted individually on a laser platform. As a result, laser systems are typically very sensitive to mechanical disturbances. To ensure stable operation, solid and heavy metals are used for the construction of known laser systems. However, the use of heavy materials is a primitive way to provide for mechanical stability, adding unnecessary weight to the laser system.

In addition, the individual parts used to construct conventional laser systems are typically manufactured using conventional CNC machining. Those parts are later assembled using screws or similar fasteners. Conventional CNC machining methods, however, are limited as to the types of geometries that can be readily produced. Therefore, use of such methods places restrictions on the geometries that may be used for parts of a laser system. This in turn limits the overall design of the laser system.

Another challenge in building laser systems is thermal management. In particular, since heat is generated during laser operation, effective cooling structures are required to dissipate that heat. If heat accumulates without being sufficiently dissipated, the metal mounts and stages can undergo thermal expansion, which can lead to laser system misalignment. Insufficient thermal management can also lead to stress fractures and thermal lensing in laser crystals. Stress fractures limit average power and thermal lensing can affect the output beam quality.

One known mechanical mounting mechanism used in laser systems is commonly referred to as a cage and rail system. A number of such cage and rail systems are commercially available as off-the-shelf components. Such off-the-shelf components, however, not fully optimized for particular applications and often cannot be customized to fulfill a special need of a customer. This is especially true for portable laser systems where compact size and light weight are important factors to be considered. For a typical cage and rail system, the cage plates are made of aluminum while the rails are made of stainless steel. The plates are bolted to the rails by screws. As noted above, this configuration is not only sensitive to mechanical vibration but also thermal shock.

Given the limitations of commercial-off-the-shelf components, there exists a strong need for a laser manufacturing method that allows a laser system to be built in a compact, light-weight and rigid design, with the ability to fulfill individual, special customer needs and at a lower cost.

SUMMARY OF THE INVENTION

In one embodiment, a laser frame for holding a plurality of optical components is provided. The laser frame includes a first flexure structure for adjustably holding a first one of the optical components, and a first cellular structure for supporting and cooling a second one of the optical components. In this embodiment, the first flexure structure and the first cellular structure are each a unitary structure formed by additive manufacturing.

In another embodiment, a method of making a laser frame for holding a plurality of optical components is provided. The method includes forming a first flexure structure for adjustably holding a first one of the optical components using an additive manufacturing process, and forming a first cellular structure for supporting and cooling a second one of the optical components using the additive manufacturing process. In this embodiment, the first flexure structure and the first cellular structure are each a unitary structure.

In yet another embodiment, a laser frame for holding an optical component is provided that includes a passive cooling cellular structure for supporting and cooling the optical component. The passive cooling cellular structure has a non-uniform density, and the laser frame is a unitary structure formed by additive manufacturing.

In still another embodiment, a method of making a laser frame for holding an optical component of a laser system is provided. The method of this embodiment includes forming a passive cooling cellular structure for supporting and cooling the optical component by an additive manufacturing technique, wherein the passive cooling cellular structure has a non-uniform density, and wherein the laser frame is a unitary structure formed by the additive manufacturing technique.

DETAILED DESCRIPTION OF EXEMPLARY EMBODIMENTS

Figure 1:
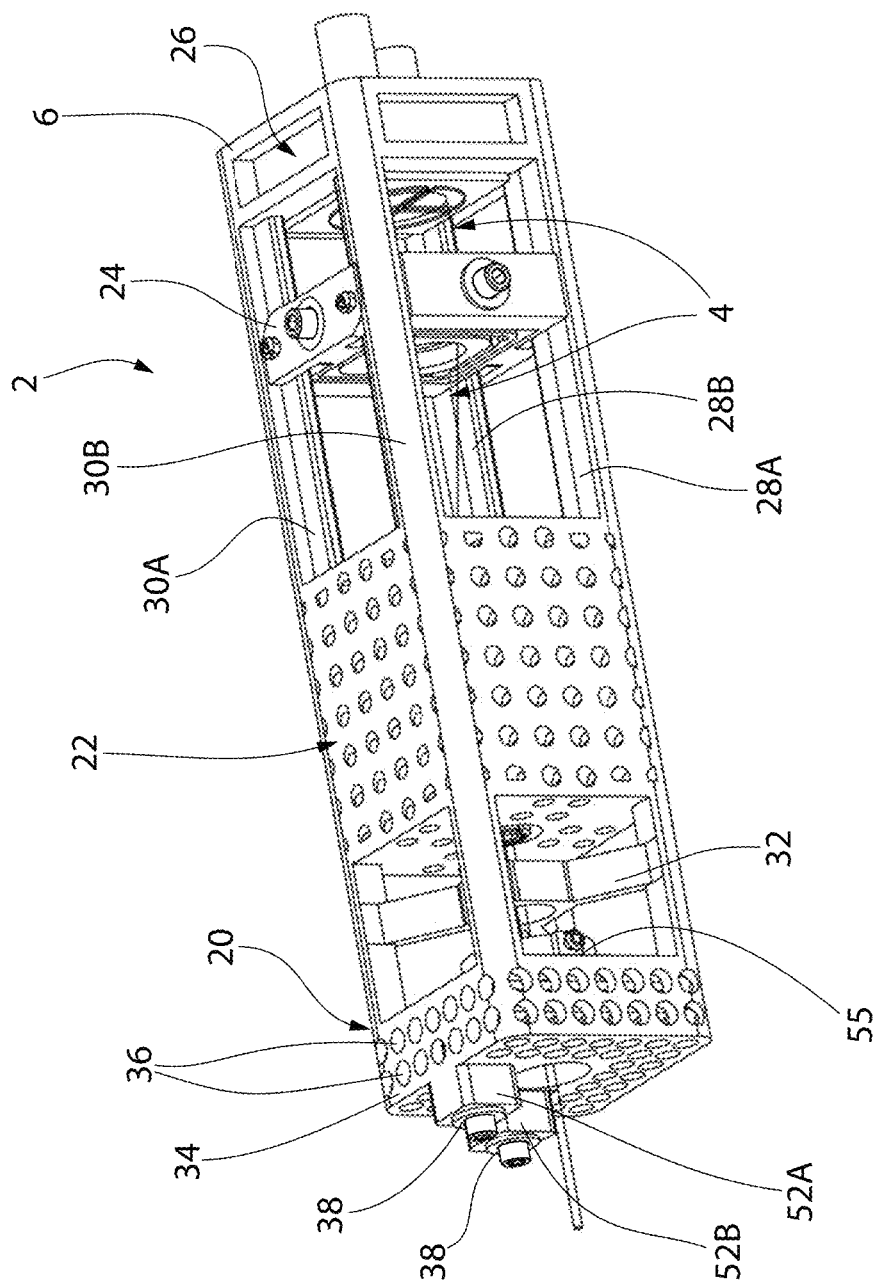
FIG. 1 is an isometric schematic view of a laser system according to a non-limiting, exemplary embodiment of the disclosed concept.

As used herein, the singular form of "a", "an", and "the" include plural references unless the context clearly dictates otherwise. As used herein, the statement that two or more parts or components are "coupled" shall mean that the parts are joined or operate together either directly or indirectly, i.e., through one or more intermediate parts or components, so long as a link occurs.

As used herein, "directly coupled" means that two elements are directly in contact with each other.

As used herein, "fixedly coupled" or "fixed" means that two components are coupled so as to move as one while maintaining a constant orientation relative to each other.

As used herein, the word "unitary" means a component is created as a single piece or unit. That is, a component that includes pieces that are created separately and then coupled together as a unit is not a "unitary" component or body.

As used herein, the statement that two or more parts or components "engage" one another shall mean that the parts exert a force against one another either directly or through one or more intermediate parts or components.

As used herein, the term "number" shall mean one or an integer greater than one (i.e., a plurality).

As used herein, the term "additive manufacturing" shall mean a manufacturing process wherein three-dimensional objects are synthesized by forming successive layers of material under computer control to create the object.

As used herein, the term "flexure structure" shall mean a structure having one or more planar portions and one or more joining portions, such as bend portions, provided between adjacent planar portions, wherein one or more of the joining portions is/are structured to yield when a force is applied to one or more planar portions such that the one or more planar portions are moveable.

As used herein, the term "cellular structure" shall mean a structure which includes a plurality of individual cells that are set together side by side horizontally and/or vertically, each cell being joined to one or more of its neighbors, to create an overall structural frame.

As used herein, the term "unit cell" shall mean an individual cell structure having a particular configuration and having a density of less than 1 that makes up all or a portion of a cellular structure.

As used herein, the term "density" as used in connection with a cellular structure shall mean the ratio of the volume of solid material in a unit cell to the total volume of the unit cell as defined by the outer boundary of the unit cell (i.e., including the solid material and the air that makes up the unit cell).

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

The present invention will now be described, for purposes of explanation, in connection with numerous specific details in order to provide a thorough understanding of the subject invention. It will be evident, however, that the present invention can be practiced without these specific details without departing from the spirit and scope of this innovation.

The disclosed concept as described herein provides a compact, lightweight, and rigid laser device that includes a laser cavity and a laser frame for holding the components of the laser cavity that is manufactured using additive manufacturing technology, also commonly referred to as 3D printing technology. In one particular embodiment, the laser device is an end-pumped Nd:YAG Q-switched laser. According to the disclosed concept, the entire laser frame is 3D printed layer by layer, with at least a portion of the laser frame being so formed as a single solid piece. Such a unibody construction not only makes the laser frame mechanically strong, but also maintains a compact and lightweight design. As described in more detail herein, the laser frame includes two integrated, complex optical mounts that are based on flexure structures, and two integrated cooling mounts that are based on cellular structures.

The laser frame and manufacturing technique of the disclosed concept, which may be customized as needed, allows for laser designs to no longer be limited by commercial-off-the-shelf mechanical components. Instead, a large number of mechanical designs can be implemented to reduce the size and weight and to improve functionality, which is particularly useful for portable laser systems. Furthermore, the additive layer-by-layer approach of the disclosed concept enables multiple laser components to merge into a single solid piece. This feature not only reduces the requirement of post-machining and assembling, but also improves the rigidity of the whole system. Moreover, the modification of laser designs can be easily achieved digitally using computer-aided design (CAD) software, and the modified design can be manufactured using the same additive, layer-by-layer 3D printing process. Thus, diverse and distinct scientific needs can be met by the disclosed concept without incurring additional manufacturing cost.

FIG. 1 is an isometric schematic view of a laser system 2 according to a non-limiting, exemplary embodiment of the disclosed concept. In the non-limiting, exemplary embodiment, laser system 2 is a vertical-cavity surface-emitting laser (VCSEL) end pumped passively Q-switched YAG laser, although it will be appreciated that other configurations are contemplated within the scope of the disclosed concept. Laser system 2 includes a laser cavity 4, shown schematically in FIG. 2 and described in detail herein, and a laser frame 6 that, as shown in FIG. 1, houses the optical components of laser cavity 4.

Laser frame 6 (a portion of which is shown in isometric and cross sectional views in FIGS. 3 and 4 discussed in detail below) is manufactured using an additive manufacturing method. In the non-limiting, exemplary embodiment, laser frame 6 is manufactured using a powder-bed direct metal laser sintering (DMLS) technique to print laser frame 6 (in the exemplary embodiment, aluminum is used). It will be appreciated, however, that this is meant to be exemplary only and that other additive manufacturing techniques may also employed within the scope of the disclosed concept. As is well-known known in the art, DMLS technology takes a computer-aided design (CAD) model as its input and builds up the geometry of the object additively, layer-by-layer, by firing a laser into a bed of powdered metal. More specifically, for each layer of a build, a DMLS deposits a layer of tiny particles across a build platform. A focused laser beam is then moved across the powder in a path that is defined by the CAD file. The metal powder that is hit by the laser beam is melted into a solid part. After each layer is built, the build platform is lowered by one layer thickness, and the whole process is repeated until the entire part has been built.

Figure 2:
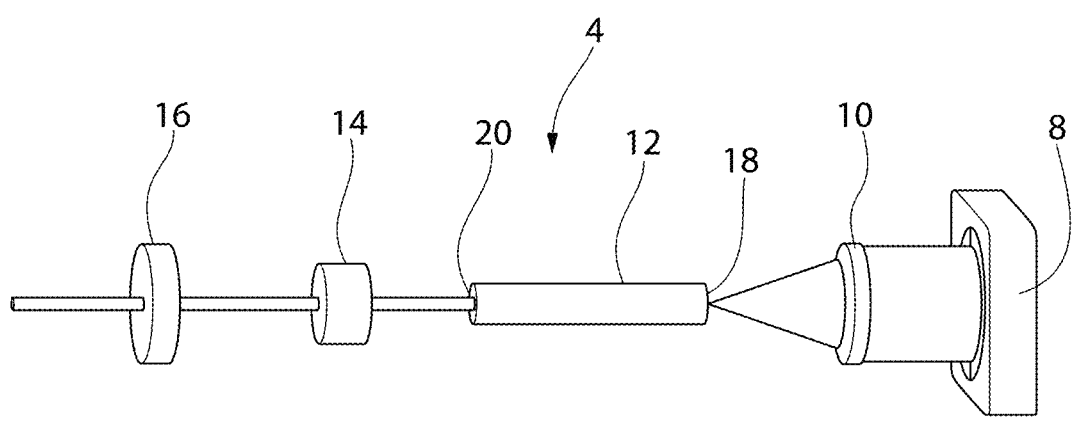
FIG. 2 is an isometric schematic view of a laser cavity forming a part of the laser system of FIG. 1 according to a non-limiting, exemplary embodiment of the disclosed concept.

Referring to FIG. 2, laser cavity 4 according to the illustrated exemplary embodiment includes a vertical-cavity surface-emitting laser (VCSEL) array pump laser 8, a focusing lens 10, an Nd:YAG crystal rod 12, a Cr:YAG passive absorber 14, and an output coupler 16. In the exemplary embodiment, pump laser 8 is structured to deliver a maximum output power of 800 W at 200 A with a wavelength of 806.9 nm, although higher powers are also possible. Pump laser 8 is also structured to operate in quasi-cw mode to permit high output powers without exceeding the thermal limitation of pump laser 8. Pump laser 8 is configured to end-pump crystal rod 12. Focusing lens 10, which in the exemplary embodiment has a 10 mm focal length, couples the pump light from pump laser 8 into the crystal rod 12 through a pump end 18 thereof. Pump end 18 of crystal rod 12 functions as an end mirror of laser cavity 4. In particular, in the exemplary embodiment, pump end 18 is provided with an anti-reflection (AR) coating for the pump wavelength of 806.9 nm and a high-reflection coating for the lasing wavelength of 1064 nm on the side facing pump laser 8. Crystal rod 12 also has an output end 20 on which an AR coating for the lasing wavelength is provided. Passive absorber 14 is also AR coated and, in the exemplary embodiment, has an initial transmission of 55% at the lasing wavelength. Output coupler 16 has, in the exemplary embodiment, a transmission of 50% and functions as the output coupling mechanism of laser cavity 4. When laser cavity 4 is lasing, it requires strict alignment and stability. Such strict alignment and stability is provided by additive manufactured laser frame 6, which is described in detail below.

Figure 3:
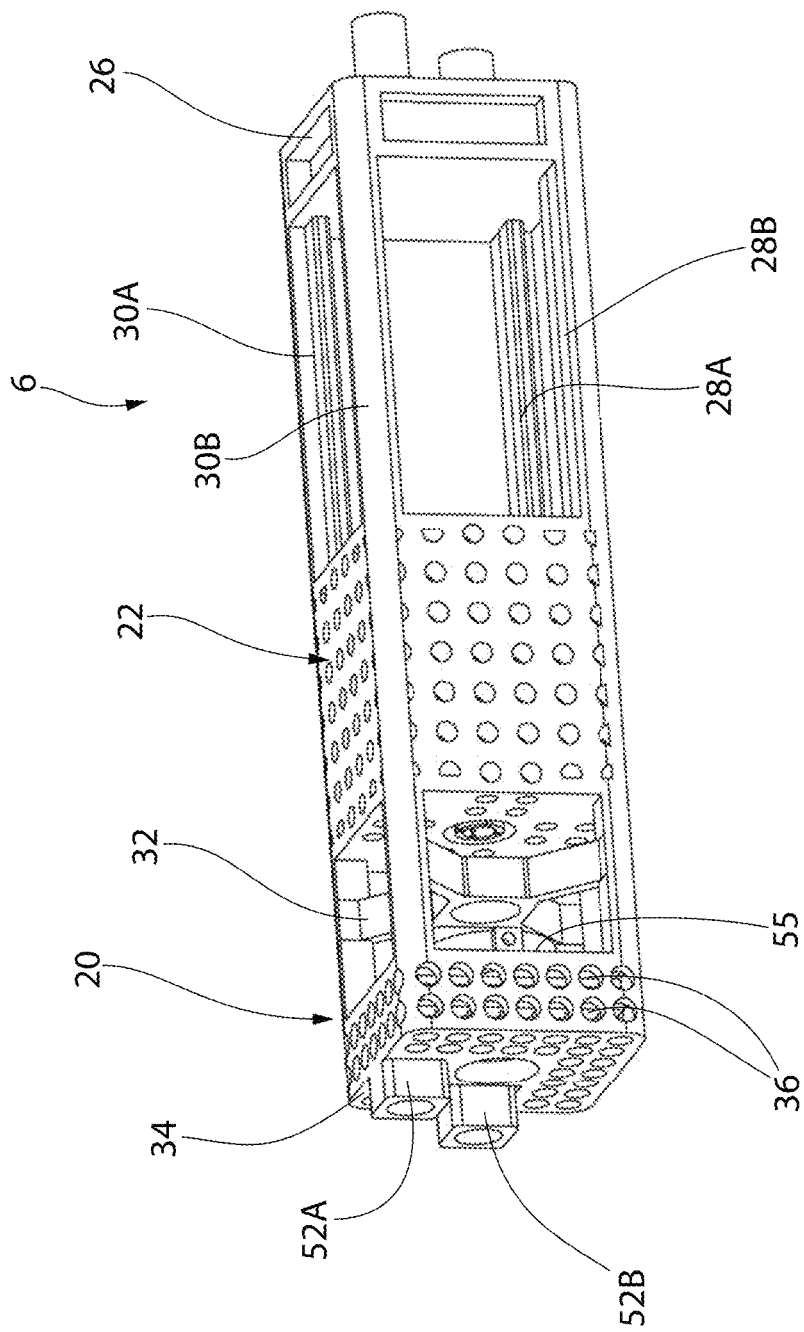
FIGS. 3 and 4 are isometric and cross sectional views, respectively, of a laser frame forming a part of the laser system of FIG. 1 according to a non-limiting, exemplary embodiment of the disclosed concept.
Figure 4:
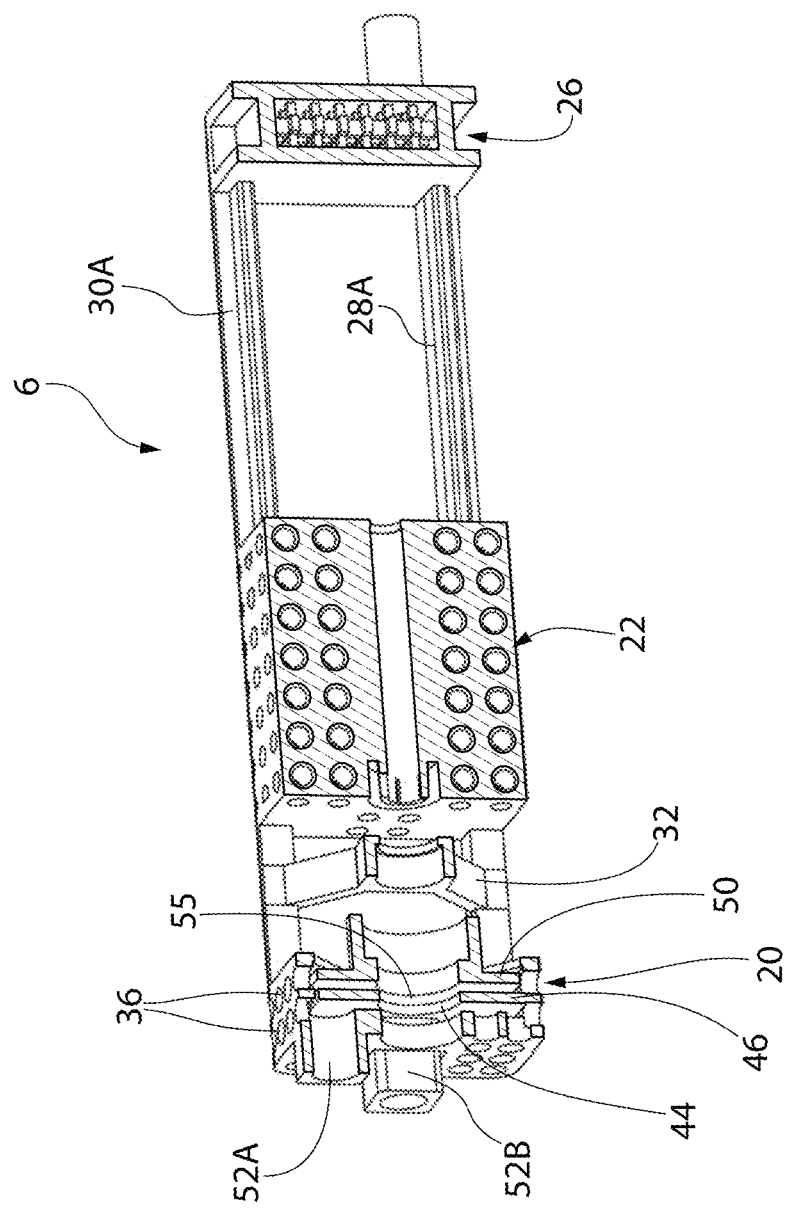

Referring to FIGS. 1, 3 and 4, laser frame 6 features four main functional structures. Those four main functional structures are: (i) a 2-axis adjustable mirror mount 20 for adjustably holding output coupler 16, (ii) a passive air cooling mount 22 for holding and cooling crystal rod 12, (iii) a 3-axis adjustable lens mount 24 (shown in FIG. 1 but not in FIGS. 3 and 4) for adjustably holding focusing lens 10, and (iv) an active water cooling mount 26 for holding and cooling pump laser 8. Each of these four main functional structures is described in greater detail herein. Laser frame 6 also includes bottom rails 28A and 28B and top rails 30A and 30B for providing structural support to the four main functional features just identified. Laser frame 6 still further includes an X-shaped holder 32 for holding passive absorber 14. As seen in FIGS. 1, 3 and 4, X-shaped holder has four legs that connect to the rails 28A, 28B, 30A and 30B, and a center hole for holding passive absorber 14. In the exemplary embodiment shown in FIGS. 1, 3 and 4, 2-axis adjustable mirror mount 20 is protected by an integral case 34 having a series of round holes 36 provided therein. The idea of introducing the round holes 36 is to reduce the total weight. The round holes 36 are also useful for removing residue powder after printing.

In the exemplary embodiment, both 2-axis adjustable mirror mount 20 and 3-axis adjustable lens mount 24 are flexure structures. Flexure structures offer many merits over traditional bearing stages used in prior art laser systems, such as being backlash free, frictionless, and exhibiting highly repeatable motion. In the prior art, flexure structures are usually machined out of a single piece of metal. The additive manufacturing method of the disclosed concept makes it possible to design functional flexure structures that would be very difficult or impossible to make using the conventional machining manufacturing methods. Specifically, with additive manufacturing, multiple components can be integrated into fewer parts, offering a more rigid structure.

FIGS. 1, 3 and 4 show a first exemplary embodiment of 2-axis adjustable mirror mount 20. 2-axis adjustable mirror mount 20 is a flexure structure that provides for angular adjustment, in particular, selective independent angular adjustment in two orthogonal dimensions. In FIG. 1, 2-axis adjustable mirror mount 20 is shown with hex adjustment members 38 disposed therein. Hex adjustment members 38 are not formed as part of the additive manufacturing process of the disclosed concept, but rather are added to laser frame 6 after it is formed. The function of hex adjustment members 38 is described elsewhere herein.

Figure 5:
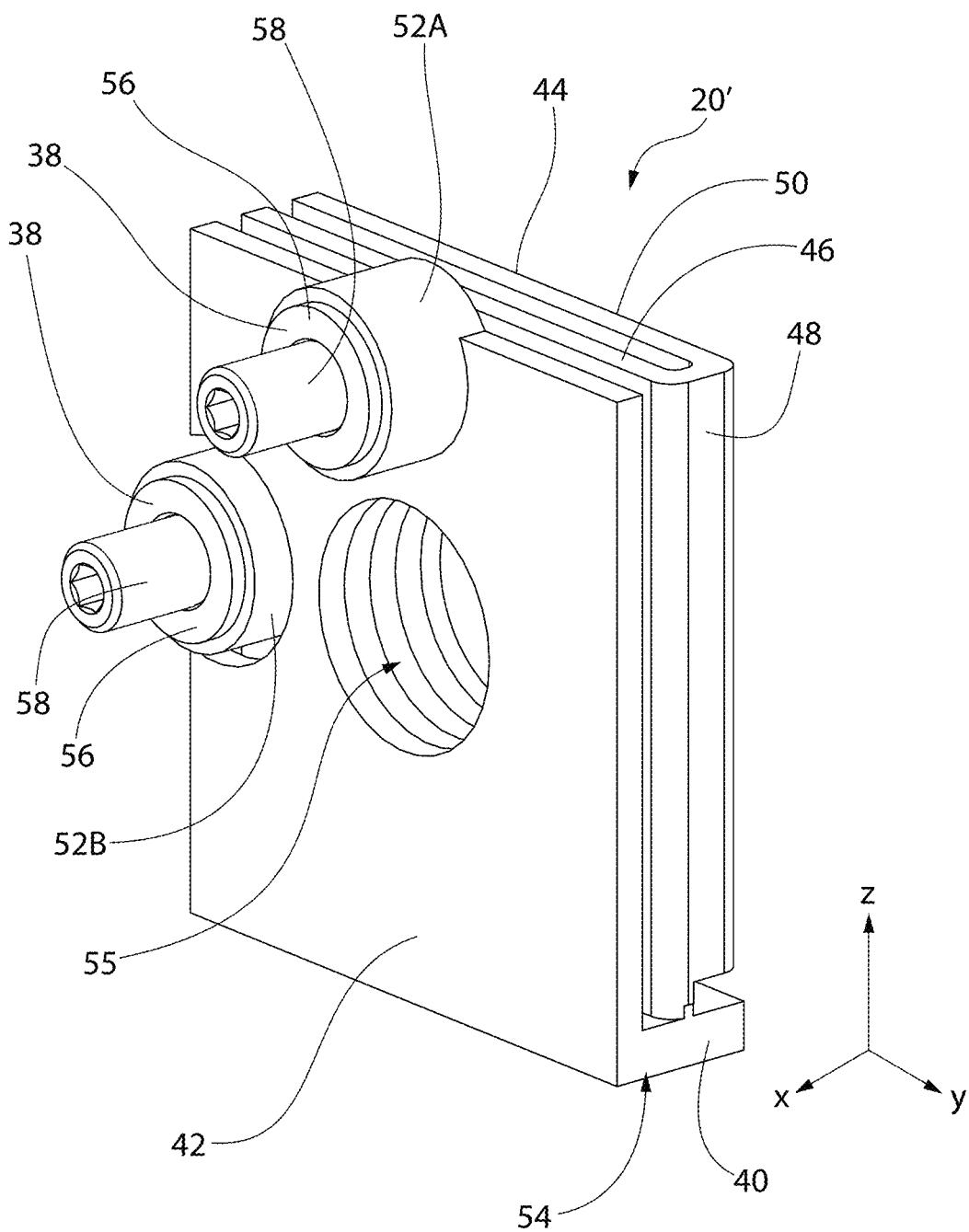
FIG. 5 is an isometric view and FIG. 6 is a top plan view of an alternative exemplary embodiment of a 2-axis adjustable mirror mount forming a part of the laser system of FIG. 1 according to a non-limiting, exemplary embodiment of the disclosed concept.
Figure 6:
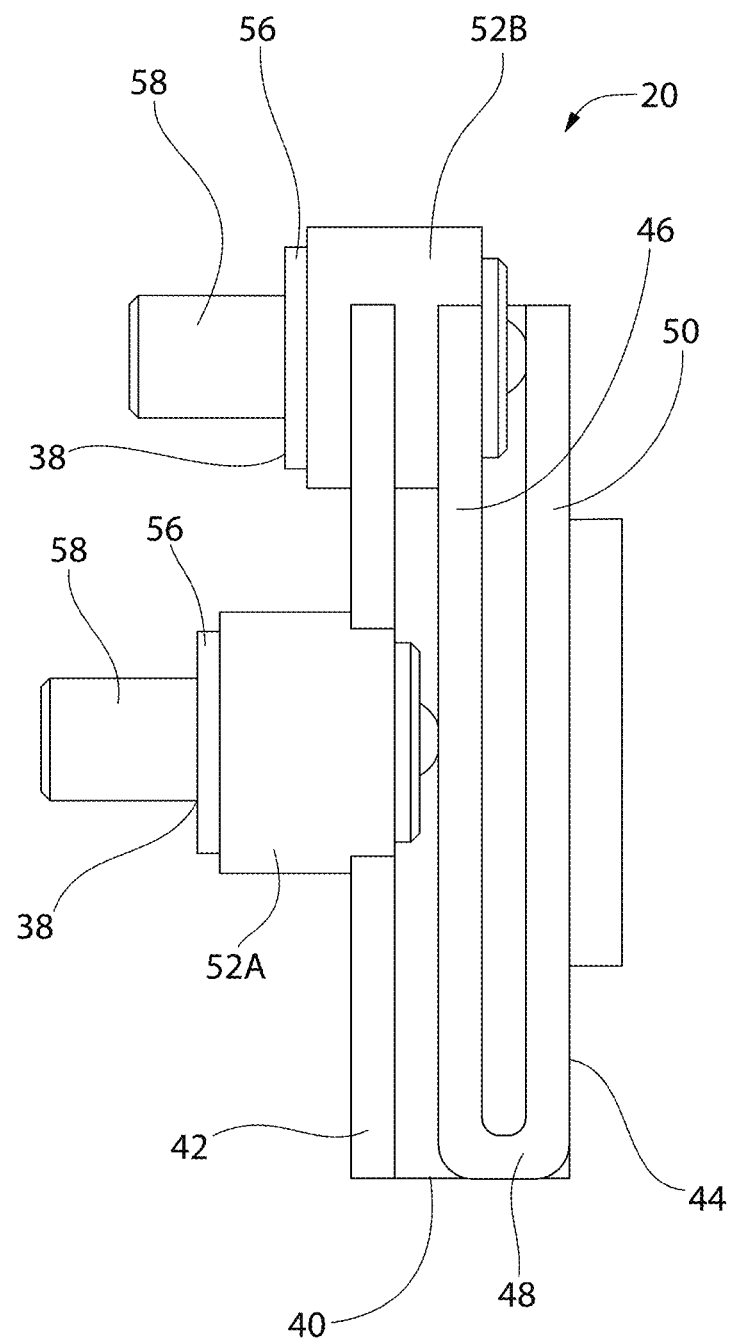

FIG. 5 is an isometric view and FIG. 6 is a top plan view of an alternative exemplary embodiment of a 2-axis adjustable mirror mount, labeled 20', that may be used in place of 2-axis adjustable mirror mount 20. 2-axis adjustable mirror mount 20' is similar to 2-axis adjustable mirror mount 20 shown in FIG. 1, and like parts thereof are labeled with like reference numerals. There are two major differences between the two embodiments. One is case 34 and the other is the shape of the hex adjustment mounting. In FIGS. 5 and 6, there is no protecting casing and the hex adjustment mount is cylindrical in shape, whereas in FIG. 1, there is a protecting casing and the hex adjustment mount is square in shape. When 2-axis adjustable mirror mount 20' is used to replace 2-axis adjustable mirror mount 20, it may also include case 34. 2-axis adjustable mirror mount 20' shown in FIGS. 5 and 6 will now be described in detail to demonstrate the essential features of both 2-axis adjustable mirror mount 20 and 2-axis adjustable mirror mount 20'.

Referring to FIGS. 5 and 6, 2-axis adjustable mirror mount 20' includes a base portion 40. A front wall 42 extends upwardly from base portion 40. A U-shaped flexure member 44 also extends upwardly from base portion 40 adjacent to the front wall 42. Flexure member 44 includes a first wall portion 46, a bend portion 48, and a second wall portion 50. Bend portion 48 and second wall portion 50 are not directly coupled to the base portion 40, but instead are coupled to first wall portion 46. In addition, as can be seen in FIG. 5, in the configuration just described, front wall 42, base portion 40, and first wall portion 46 form a second flexure member, labeled 54. Thus, 2-axis adjustable mirror mount 20' includes two U-shaped flexure members that are perpendicular to each other. A central hole 55 is provided through front wall 42, first wall portion 46 and second wall portion 50.

A first holder member 52A is attached to and extends from the front wall 42 and a second holder member 52B is attached to and extends from the first wall portion 46. First and second holder members 52A and 52B each include a central bore and are structured to receive therein and hold hex adjustment members 38, which include a mating part 56 and a movable fine screw 58

Each U-shape flexure member just described can perform an angular adjustment in one direction. The adjustment is achieved by adjusting the hex adjustment members 38. In particular, by adjusting the hex adjustment member 38 (by turning fine screw 58) disposed in holder member 52A (to apply a force to first wall portion 46), 2-axis adjustable mirror mount 20' can be rotated about the y-axis, and by adjusting the hex adjustment member 38 (by turning fine screw 58) disposed in holder member 52B (to apply a force to second wall portion 50), 2-axis adjustable mirror mount 20' can be rotated about z-axis. Thus, the two U-shape flexure members can provide independent angular adjustments in two respective orthogonal dimensions. In the exemplary embodiment, the adjustment range is at least 3°, which is enough for laser cavity alignment. Also in the exemplary embodiment, output coupler 16 is fixed within a central hole 55 using a screw.

Figure 7:
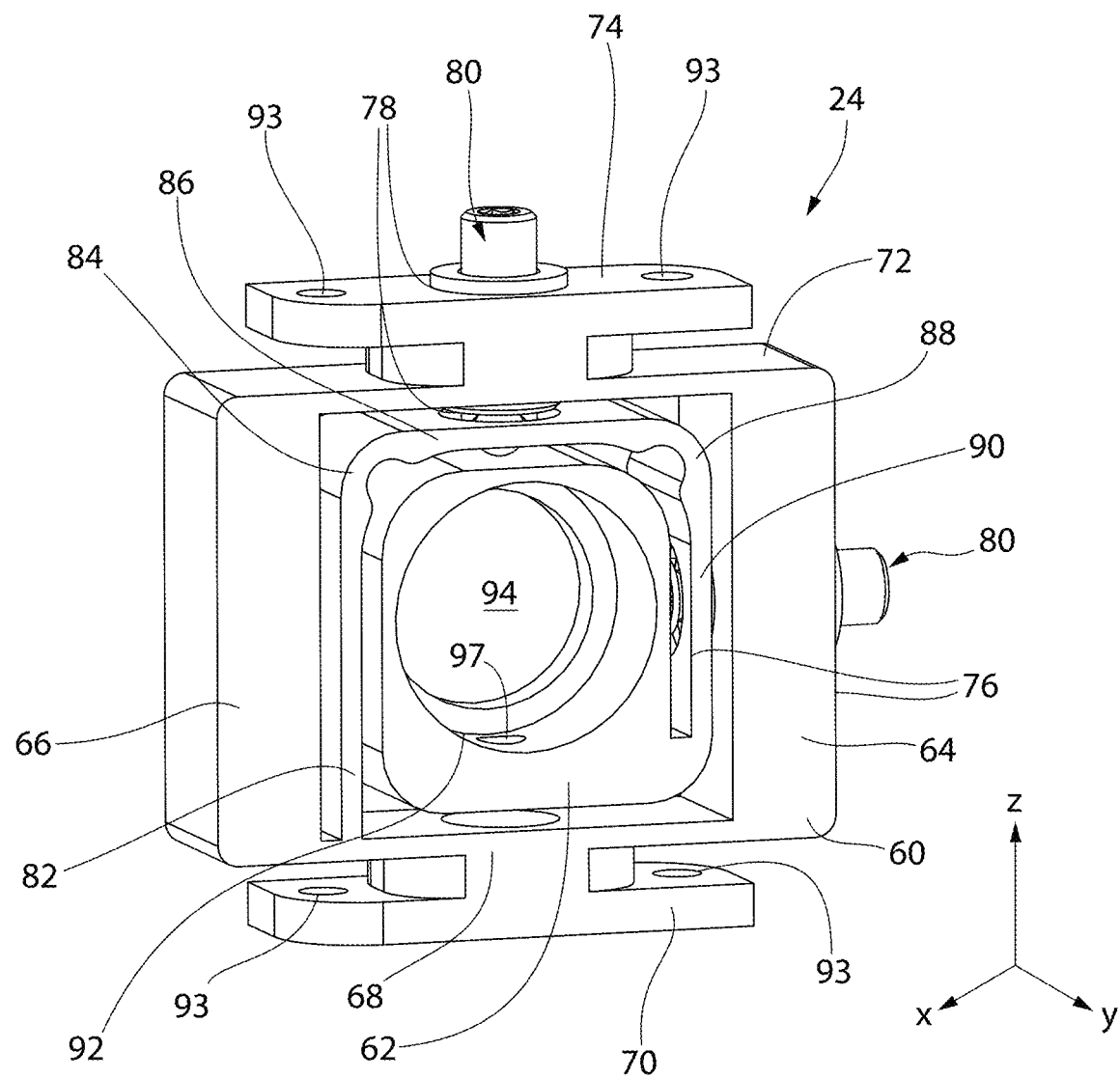
FIG. 7 is a rear isometric view of 3-axis adjustable lens mount forming a part of the laser system of FIG. 1 according to a non-limiting, exemplary embodiment of the disclosed concept.
Figure 8A:
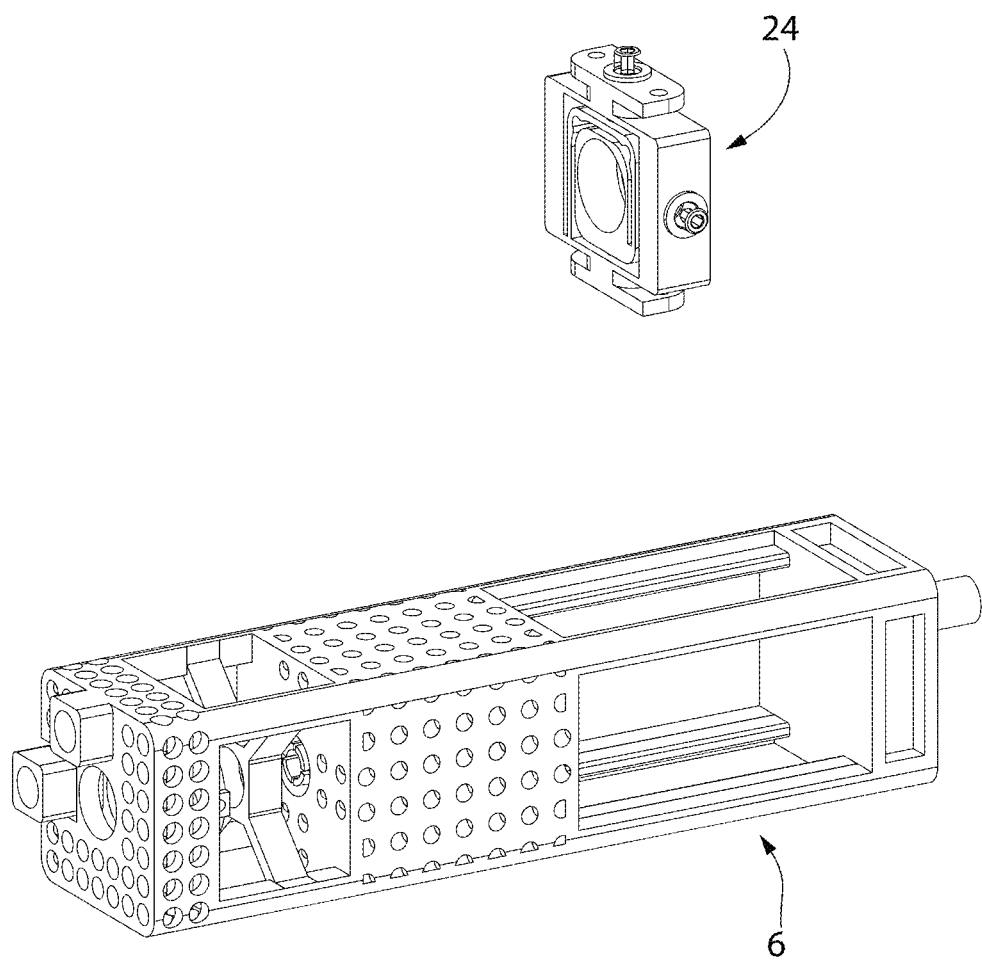
FIGS. 8A-8D are schematic diagrams illustrating assembly of the laser system of FIG. 1 according to a non-limiting, exemplary embodiment of the disclosed concept.
Figure 8B:
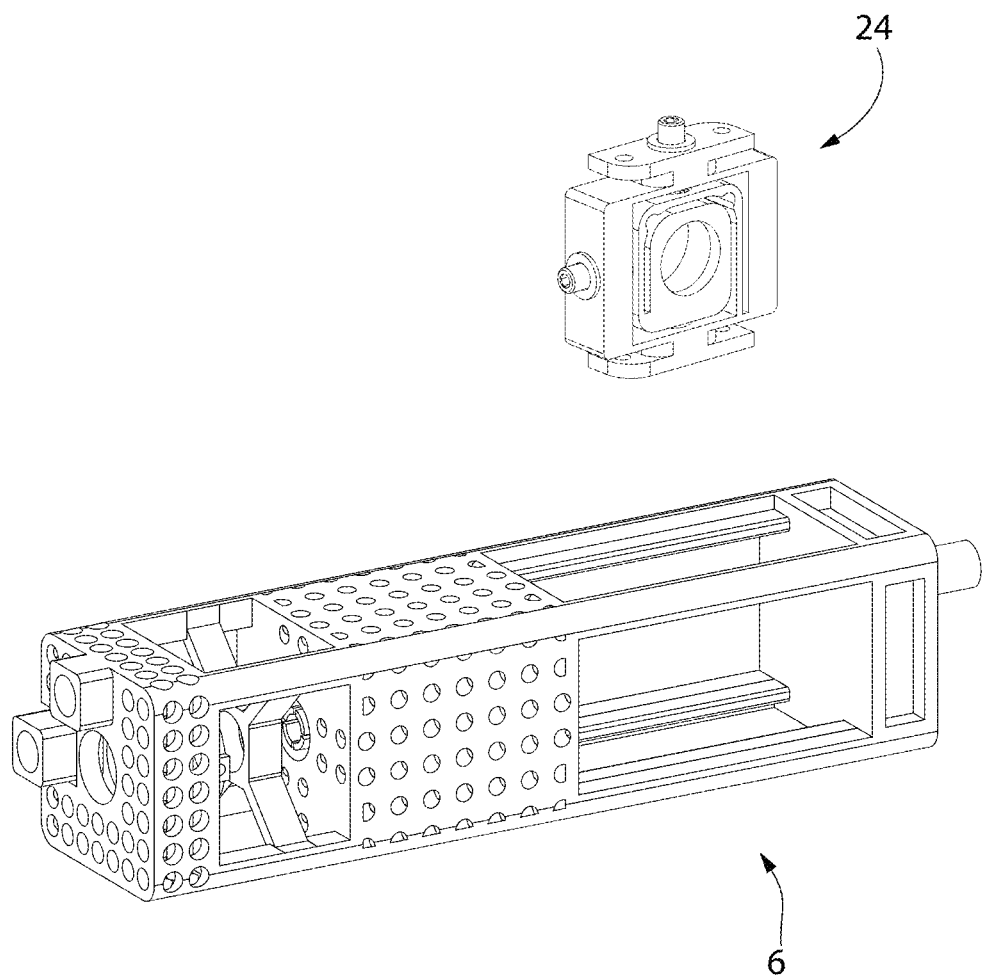
Figure 8C:
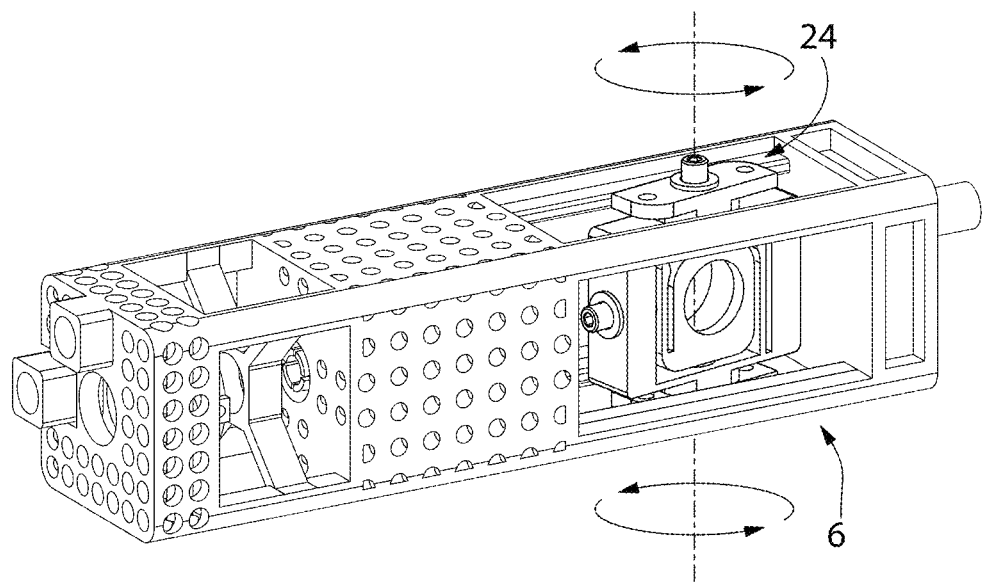
Figure 8D:
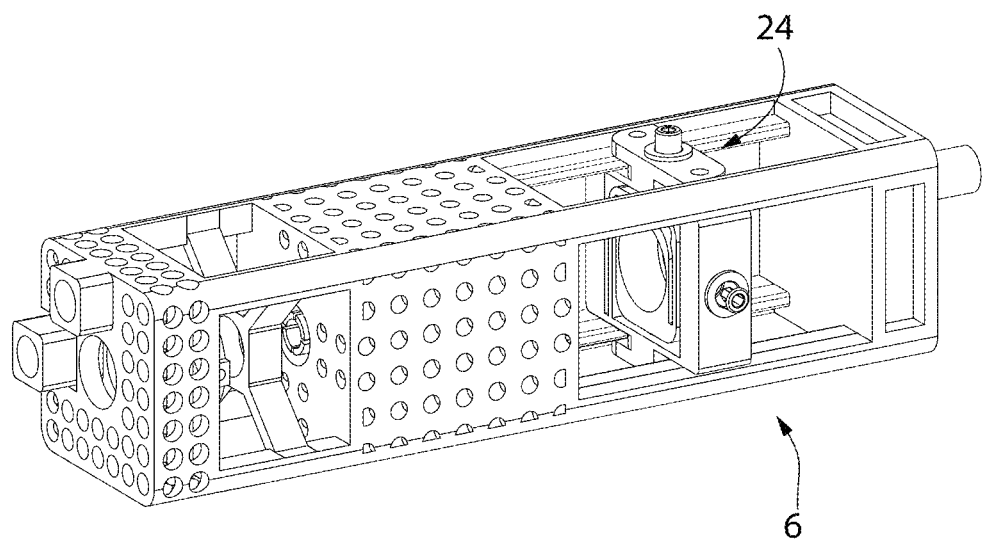

FIG. 7 is a rear isometric view of 3-axis adjustable lens mount 24 according to one exemplary embodiment of the disclosed concept. 3-axis adjustable lens mount 24 includes a frame portion 60 having a flexure member 62 supported therein. In particular, frame portion 60 includes a first side wall 64, a second, opposite side wall 66, a bottom wall 68 having a T-shaped member 70 extending therefrom, and a top wall 72 having a T-shaped member 74 extending therefrom. A hole 76 extends through first side wall 64 and third leg 90 described below and a hole 78 extends through top wall 72, T-shaped member 74, and second leg 86 described below. In FIG. 7, 3-axis adjustable lens mount 24 is shown with hex adjustment members 80 disposed therein (i.e., within holes 76 and 78). Hex adjustment members 80 are not formed as part of the additive manufacturing process of the disclosed concept, but rather are added to 3-axis adjustable lens mount 24 after it is formed. The function of hex adjustment members 80 is described herein.

Flexure member 62 includes a first leg 82 extending upwardly from the bottom wall 68, a bend portion 84 provided at the distal end of the first leg 82, a second leg 86 extending from bend portion 84 in a direction that is perpendicular to first leg 82, a bend portion 88 provided opposite bend portion 84, and a third leg 90 extending from bend portion 88 in a direction parallel to first leg 82. A holder portion 92 having a hole 94 therein is attached to the distal end of third leg 90. Holder portion 92 is spaced from third leg 90, bend portion 88, second leg 86, bend portion 84, and first leg 82. In addition, holder portion 92 is not directly coupled to bend portion 88, second leg 86, bend portion 84, or first leg 82. Tapped screw holes 93 are provided for fixing 3-axis adjustable lens mount 24 to the rails 28A, 28B, 30A and 30B. Tapped screw hole 97 is used to fix focusing lens 10 to 3-axis adjustable lens mount 24.

In the non-limiting exemplary embodiment, 3-axis adjustable lens mount 24 is formed (i.e., 3-D printed) separately from the rest of laser frame 6. Thereafter, 3-axis adjustable lens mount 24 is attached to the rest of laser frame 6 as illustrated in FIGS. 8A-8D. When assembled, flexure member 62 offers two orthogonal linear translation degrees of freedom. In particular, by adjusting hex adjustment member 80 provided in hole 78 (to cause the screw of hex adjustment member 80 to exert a force on the top of holder portion 92), flexure member 62, and in particular holder portion 92, can be moved along the z direction, and by adjusting hex adjustment member 80 provided in hole 76 (to cause the screw of hex adjustment member 80 to exert a force the side of holder portion 92), flexure member 62, and in particular holder portion 92, can be moved along the x direction. 3-axis adjustable lens mount 24 as a whole can also be moved along rails 28A, 28B, 30A, and 30B the Y direction, adding another translation degree of freedom. Focusing lens 10 is installed within hole 94 using screws. Focusing lens 10 can then be moved along rails 28A, 28B, 30A, and 30B in order to focus the pump beam of pump laser 8 onto the end face of crystal rod 12. After optimization, 3-axis adjustable lens mount 24 can then be fixed to rails 28A, 28B, 30A, and 30B using screws.

Figure 9:
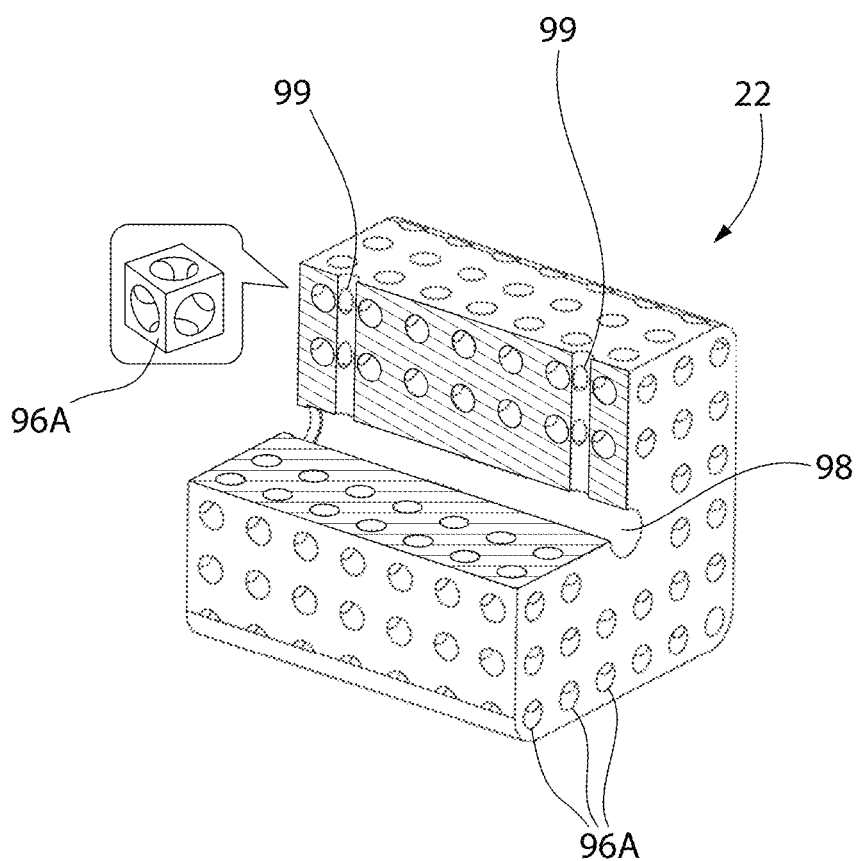
FIG. 9 is an isometric view, partially in cross-section, of a passive air cooling mount for holding and cooling a crystal rod according to an exemplary embodiment of the disclosed concept.
Figure 14:
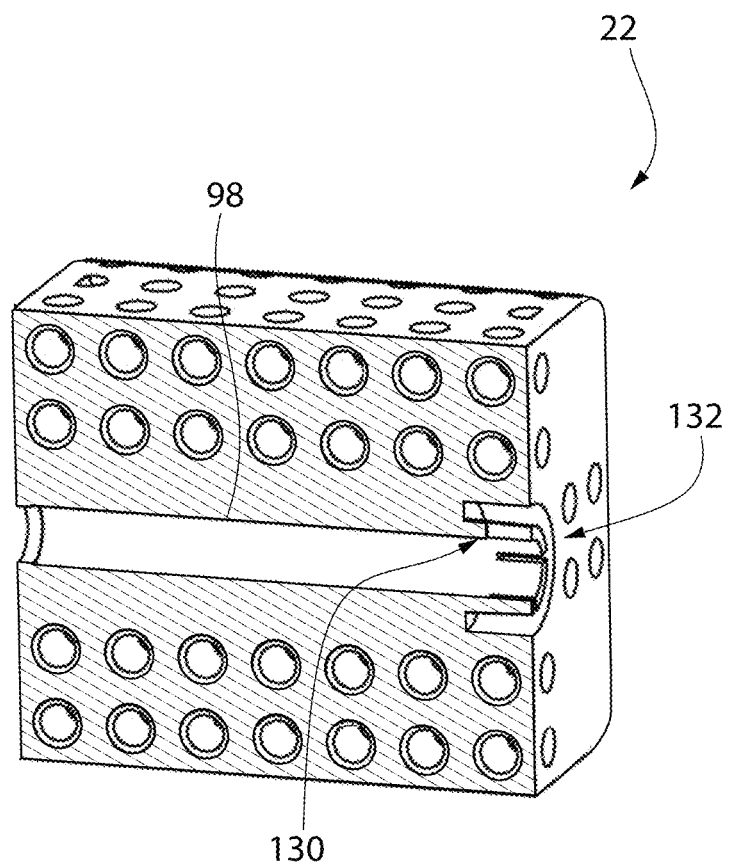
FIG. 14 is an isometric view, partially in cross-section, of a passive air cooling mount for holding and cooling a crystal rod according to an alternative exemplary embodiment of the disclosed concept.

FIG. 9 is an isometric view, partially in cross-section, of passive air cooling mount 22 for holding and cooling crystal rod 12 according to an exemplary embodiment of the disclosed concept. As seen in FIGS. 1, 3, 4 and 9, passive air cooling mount 22 is a cellular structure comprising a plurality of exemplary unit cells 96A as depicted with particularity in FIG. 9. In the exemplary embodiment, passive air cooling mount 22 has a uniform density. As described elsewhere herein, structures having non-uniform densities are also contemplated. Passive air cooling mount 22 also includes a central bore 98 that is structured to receive and hold crystal rod 12. Tapped screw holes 99 are provided for securing crystal rod 12 in place. In order to better conduct heat, thermal grease or a thin metal film may be used to cover or wrap around crystal rod 12 before it is inserted in place. In an alternative embodiment, shown in FIG. 14, crystal rod 12 may be held within a configuration including a tapered finger 130 having an 132 attached thereto that is provided within central bore 98.

Figure 10:
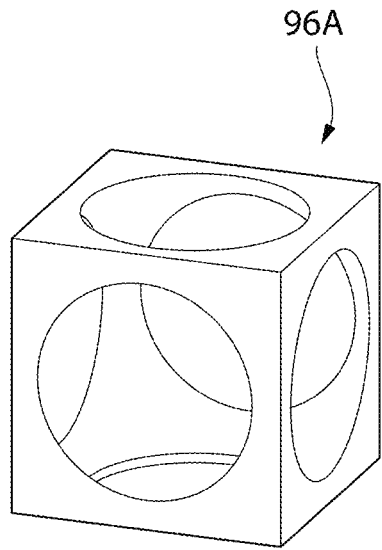
FIGS. 10-13 are isometric views of alternative exemplary unit cells forming a part of the laser system of FIG. 1 according to various non-limiting, exemplary embodiments of the disclosed concept.
Figure 11:
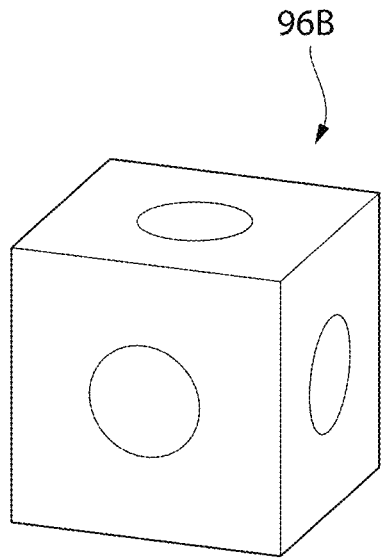
Figure 12:
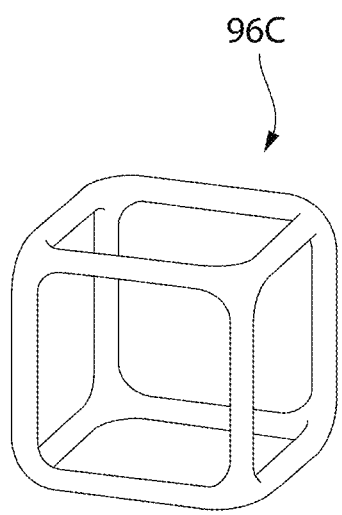
Figure 13:
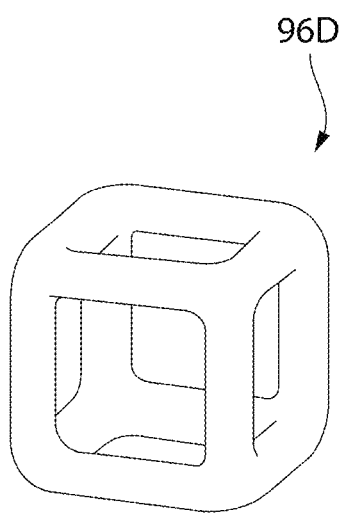

An isometric view of exemplary unit cell 96A is also shown in FIG. 10. As seen in FIG. 10, unit cell 96A is a hollow sphere structure, which is a solid cubic structure cut by a sphere. FIG. 11 is an isometric view of a unit cell 96B that is also a hollow sphere structure. As will be appreciated, unit cells 96A and 96B have different densities, with unit cell 96A having a lower density relative to unit cell 96B, which has a higher density. As will also be appreciated, the density of a hollow sphere structure can be varied by varying the radius of the sphere that cuts the unit cell (the larger the radius, the lower the density). Furthermore, unit cells are not limited to the hollow sphere structured just described, and various alternative structures may be employed within the scope of the disclosed concept. FIGS. 12 and 13 are isometric views of further alternative unit cells 96C and 96D which have a cubic lattice structure formed by twelve identical cylinders. Unit cells 96C and 96D have different densities, with unit cell 96C having a lower density relative to unit cell 96D, which has a higher density. The density of a cubic lattice structure as shown can be varied by varying the radius the cylinders make up the unit cell (the larger the radius, the higher the density).

As described elsewhere herein, laser system 2 is end pumped by pump laser 8. It is known that end-pumping produces some of the best conversion efficiencies for laser systems. However, it is also known that end-pumping is power limited by thermal induced lensing and thermal fracture damage, both of which can destabilize the laser output. It is also known that end-pumping results in higher temperatures, particularly at the pumping end. Since the pumping end has a higher temperature, it expands more. Such an uneven temperature distribution leads to uneven thermal deformation of laser crystal holders, and as a result, laser cavity alignment can be compromised.

Figure 15A:
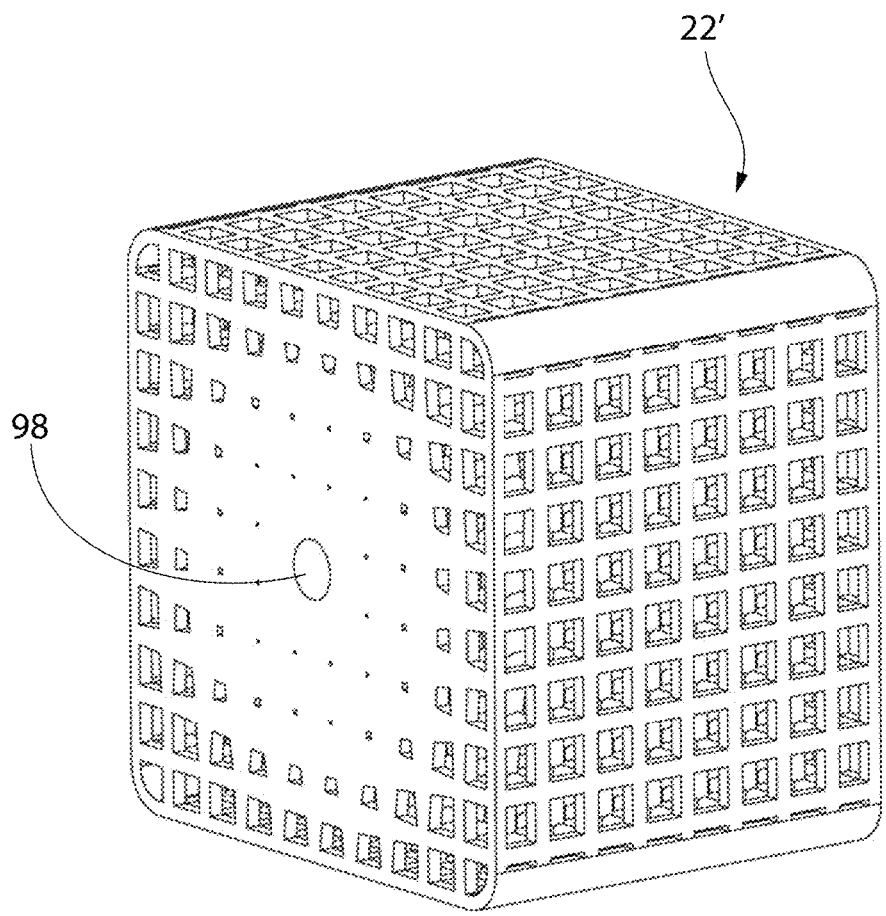
FIGS. 15A, 15B, and 15C, are rear isometric, rear elevational, and cross sectional views, respectively, of an alternative passive air cooling mount having a non-uniform density according to an alternative exemplary embodiment of the disclosed concept.
Figure 15B:
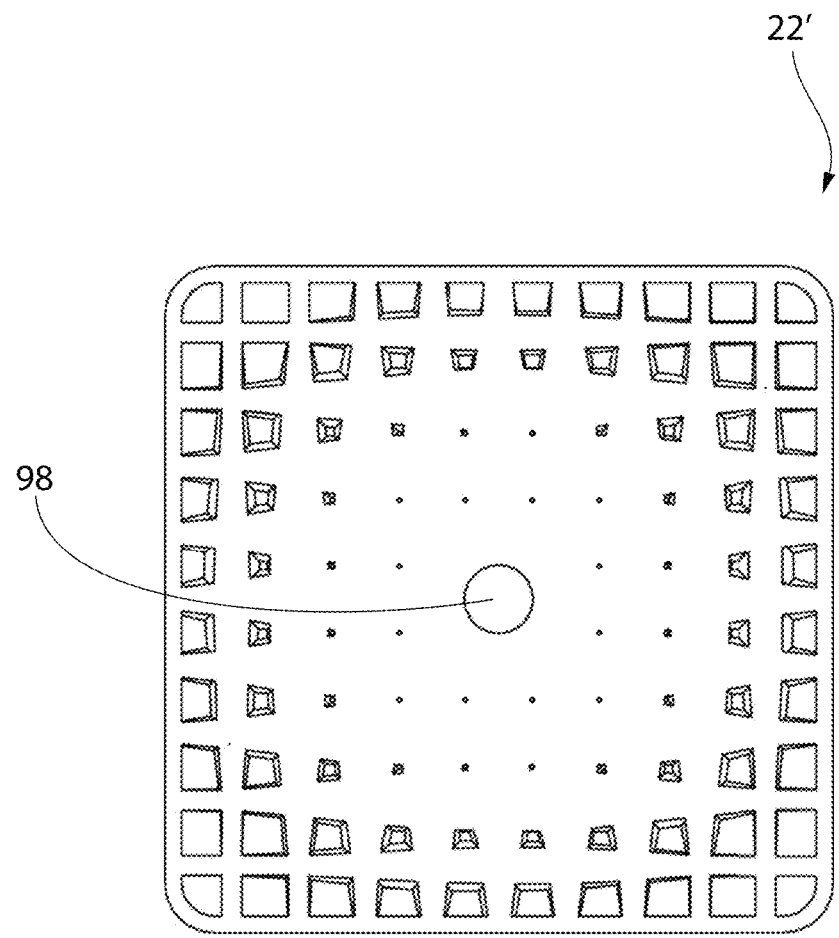
Figure 15C:
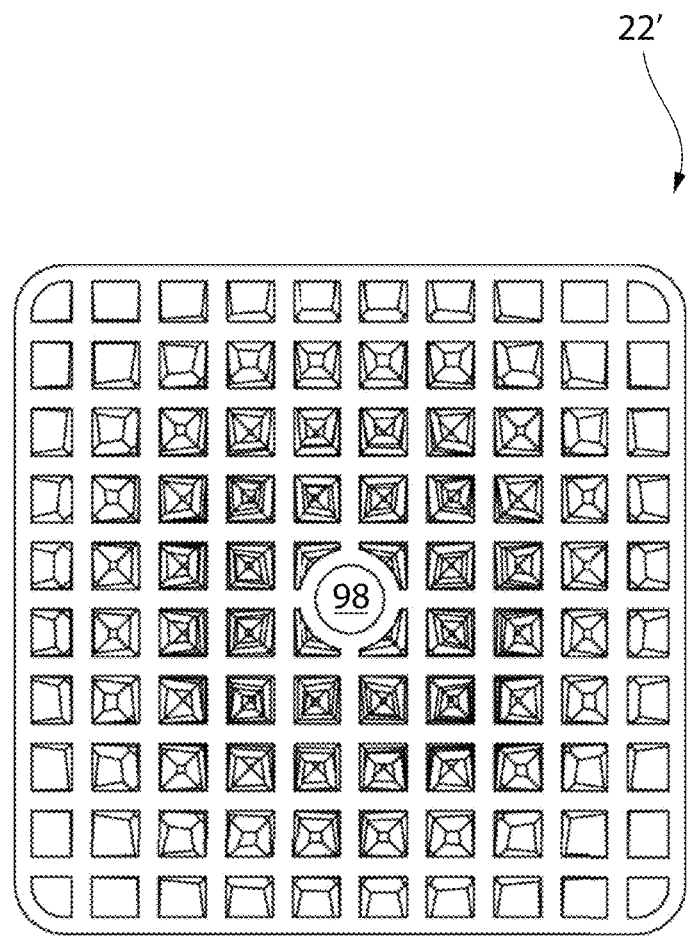

An aspect of the disclosed concept addresses these problems by providing a mechanism for more uniform temperature distribution around crystal rod 12. In particular, in one specific exemplary embodiment, in order to reduce the thermal gradient and thermal stress in the end-pumped configuration of laser system 2, passive air cooling mount 22 may be modified so as to have a varying density. In particular, the side closest to pump laser 8 would be modified to have a relatively low density, and the opposite side closest to passive absorber 14 would be modified to have a relatively high density (i.e., the density of the side closest to pump laser 8 is lower than the density of the opposite side). This may be achieved by using unit cells 96 of different densities in each location. Because the passive air cooling mount is based on convection cooling, the low density region will have a higher cooling efficiency than the high density region because of better heat exchange. The result will be more uniform temperature distribution as compared to a passive air cooling mount 22 that has a uniform density. This more uniform temperature distribution in turn result in reduced thermal lensing and reduced laser cavity misalignment. One example of such a passive air cooling mount, labeled 22' for identification purposes, having a non-uniform (varying) density is shown in FIGS. 15A, 15B, and 15C, which are rear isometric, rear elevational, and cross sectional views, respectively. As seen in FIGS. 15A, 15B, and 15C, the unit cells 96 of passive air cooling mount 22' have different metal/air filling ratios (i.e., different densities) along the optical axis. This enables individual tuning of thermal conduction and convection of each individual unit cell 96 (or groups of unit cells 96).

More particularly, since the laser system 2 is end-pumped, the Beer-Lambert law determines that the absorption of the pump light is not uniform through the length of crystal rod 12, which in the exemplary embodiment is a Nd:YAG crystal rod. Pump light is predominately absorbed by the section of crystal rod 12 toward pump laser 8. This creates a non-uniform temperature profile along the optical axis in crystal rod 12, which may lead to non-uniform thermal expansion. Depending on the mechanical boundary condition, the non-uniform thermal expansion may lead to undesirable mechanical distortion of laser cavity 4, resulting in fluctuation of laser output power and misalignment of laser cavity 4. The bottom-up additive manufacturing scheme described herein allows localized optimization of heat transfer in laser mount 6 for every single cell in the cellular structure therein, which can yield more desirable temperature profiles, and thus more uniform thermal expansion.

Figure 16A:
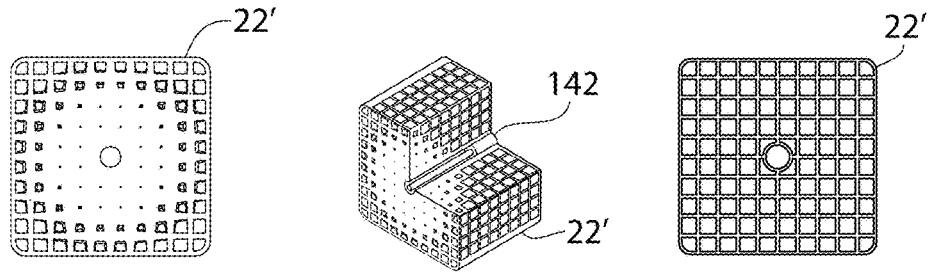
FIGS. 16A-16H compare the performance of two alternative passive air cooling mounts according to an aspect of the disclosed concept.
Figure 16B:
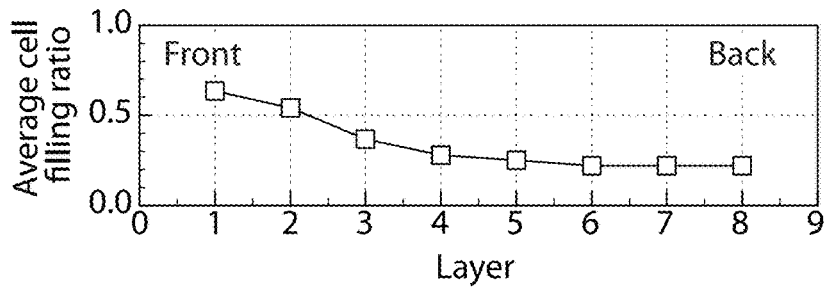

Thus, as noted above, in one exemplary embodiment of the disclosed concept, the structure of laser mount 6 was optimized to reduce thermal deformation for the end-pump configuration. In particular, to improve the uniformity of the temperature profile along the crystal rod 12, passive air cooling mount 22' was fabricated using graded cellular structures that have different metal/air filling ratios along the optical axis. This enables individual tuning of thermal conduction and convection of each single cell. FIG. 16A shows a left layer, a right layer and an isometric cross sectional view of passive air cooling mount 22' with varying metal/air filling ratio (non-uniform) cellular structures. In the illustrated exemplary embodiment, it consists of 8 (L)× 10 (W)×10 (H) cells with 4 mm unit size of open-cell cubic cellular structures. The average metal filling ratio profile of passive air cooling mount 22' along the optical axis is shown in FIG. 16B, which varies from 0.63 (left) to 0.21 (right). It was optimized by means of a cellular structure topology optimization method, which accounts for both convection and conduction heat transfer. The exemplary optimization method is described in Cheng, L., et al., "Integration of Topology Optimization with Efficient Design of Additive Manufactured Cellular Structures", AC to Proceedings of the Solid Freeform Fabrication (SFF) Conference, 4, 2015; Cheng, L., et al., "Coupling lattice structure topology optimization with design-dependent feature evolution for additive manufactured heat conduction design", Computer Methods in Applied Mechanics and Engineering, 2018; and Cheng, L., et al., "Efficient design optimization of variable-density cellular structures for additive manufacturing: theory and experimental validation", Rapid Prototyping Journal, 2017, 23(4), the disclosures of which are incorporated herein by reference. The aim of the optimization is to minimize the temperature gradient along crystal rod 12 considering both conduction and convection heat transfer under volume fraction constraint. By iteratively adjusting relative density of the cellular structure in passive air cooling mount 22', the temperature difference is minimized, and thus the deformation between the front and back of passive air cooling mount 22' is reduced. Once the relative density profile is determined by the iterative optimization, a reconstruction process is proposed to realize the design of the graded cellular structure by taking the constraints of metal additive manufacturing (e.g., maximum overhang without support structure) into account. The graded cellular infill can thus be printed out without extra effort and be used for end-usable applications.

Figure 16C:
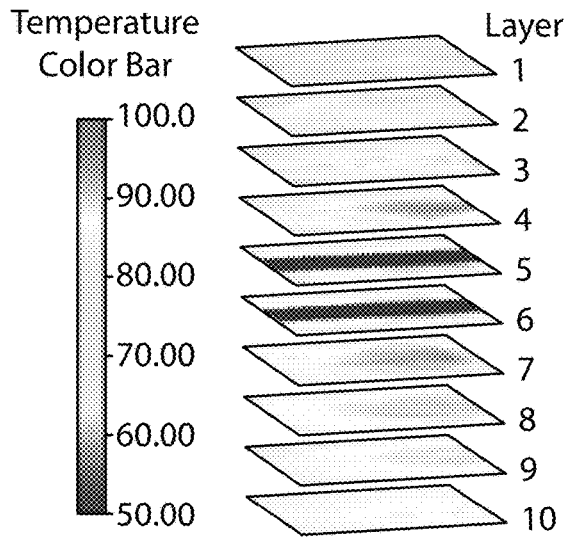

To evaluate the thermo-mechanical properties of passive air cooling mount 22', as seen in FIG. 16A, a 6-mm long electric heating rod 142 was inserted into central bore 98 to simulate the heating profile induced by non-uniform pump laser absorption crystal rod 12. The heating power was set at 15 W, and the temperature profile of every single cell in the cellular structure was measured by a distributed fiber optical temperature sensor using Rayleigh backscattering optical frequency reflectometry with 4-mm spatial resolution. The spatial resolution of the fiber sensor is identical to the lattice constant of the cellular structure. The 3D temperature profile of the entire passive air cooling mount 22' was mapped layer-by-layer into the 10 layer temperature contour presented in FIG. 16C. The temperature profile measurement was performed at t=400 seconds after the heater 142 was turned on. The layer-by-layer temperature profiles of each horizontal layer shows how heat is dissipated through the cellular structure when it is cooled in a static ambient environment with the bottom side in contact with a metal base.

Figure 16D:
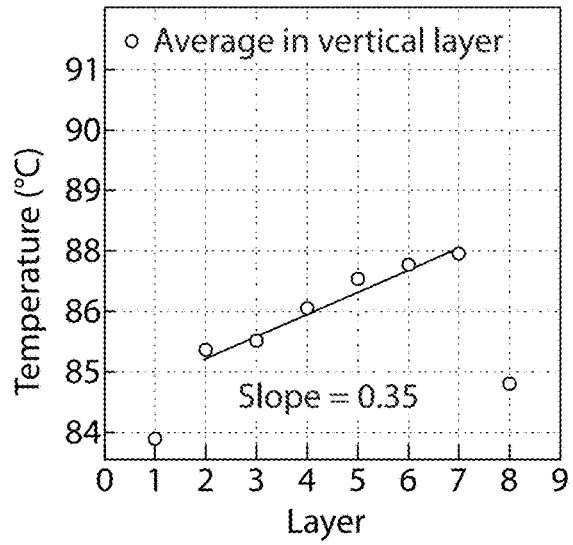

To quantify the temperature distribution along the optical axis, the average temperature of each vertical layer from layer 1 (left) to layer 8 (right) is plotted in FIG. 16D. The average temperature of each vertical layer inside the cellular structure (Layers 2-7) along the optical axis has a linear temperature distribution between 85.2° C. and 87° C. with a linear temperature slope of 0.35° C./layer (4-mm layer-to-layer spacing). The temperature of Layer 1 and 8 at both sides of the cellular structure deviate from the linear temperature distribution due to strong convection cooling.

Figure 16E:
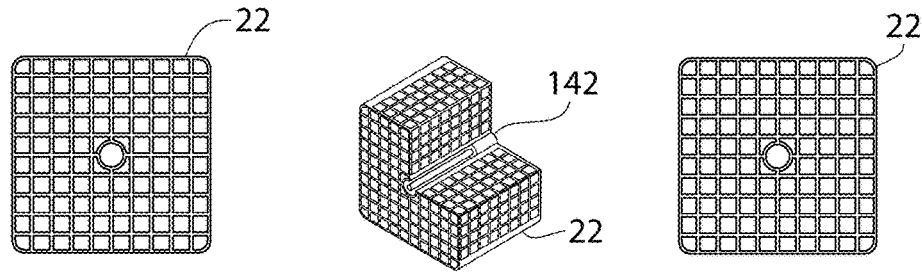
Figure 16F:
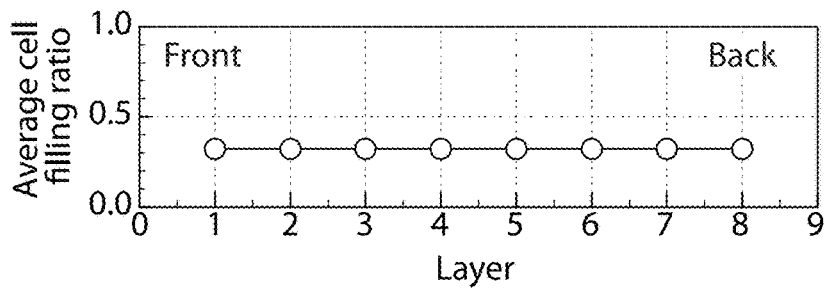
Figure 16G:
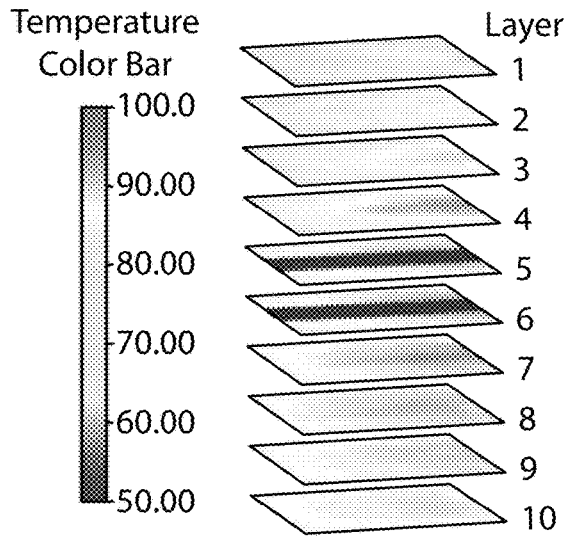
Figure 16H:
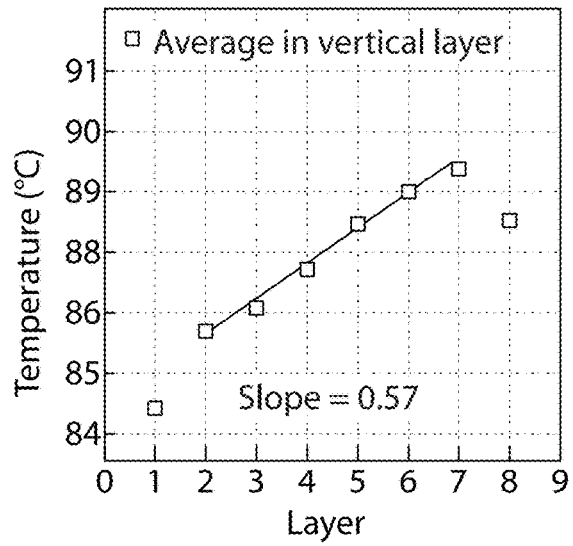

As a comparison, passive air cooling mount 22 with uniform cellular density shown in FIG. 16E was tested under the same conditions. Each cell in passive air cooling mount 22 in the illustrated embodiment has a uniform metal/air filling ratio of 0.32 as shown in FIG. 16F. This ensures passive air cooling mount 22 has an overall identical volume fraction (weight) as passive air cooling mount 22'. Using the same distributed fiber optical temperature sensor, a layer-by-layer temperature profile of each horizontal layer was mapped and is shown in FIG. 16G. The average temperature of vertical layers 1 to 8 along the optical axis was also calculated and plotted in FIG. 16H. Similar to passive air cooling mount 22', passive air cooling mount 22 also produces a linear temperature profile from vertical layer 2 to 7 inside the cellular structure but with a temperature gradient of 0.57° C./layer. The temperature gradient for passive air cooling mount 22' is thus 39% lower than that of passive air cooling mount 22, which will lead to less thermal-induced deformation.

Figure 17B:
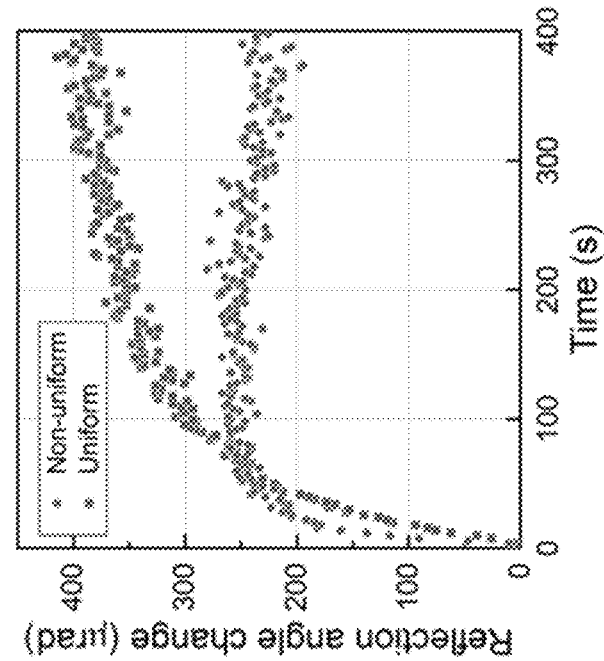
FIGS. 17A and 17B show an experimental set up to study the thermal deformation of a passive air cooling mount and the impact on distortion of the optical cavity according to another aspect of the disclosed concept, and the results of that experimentation.
Figure 17A:
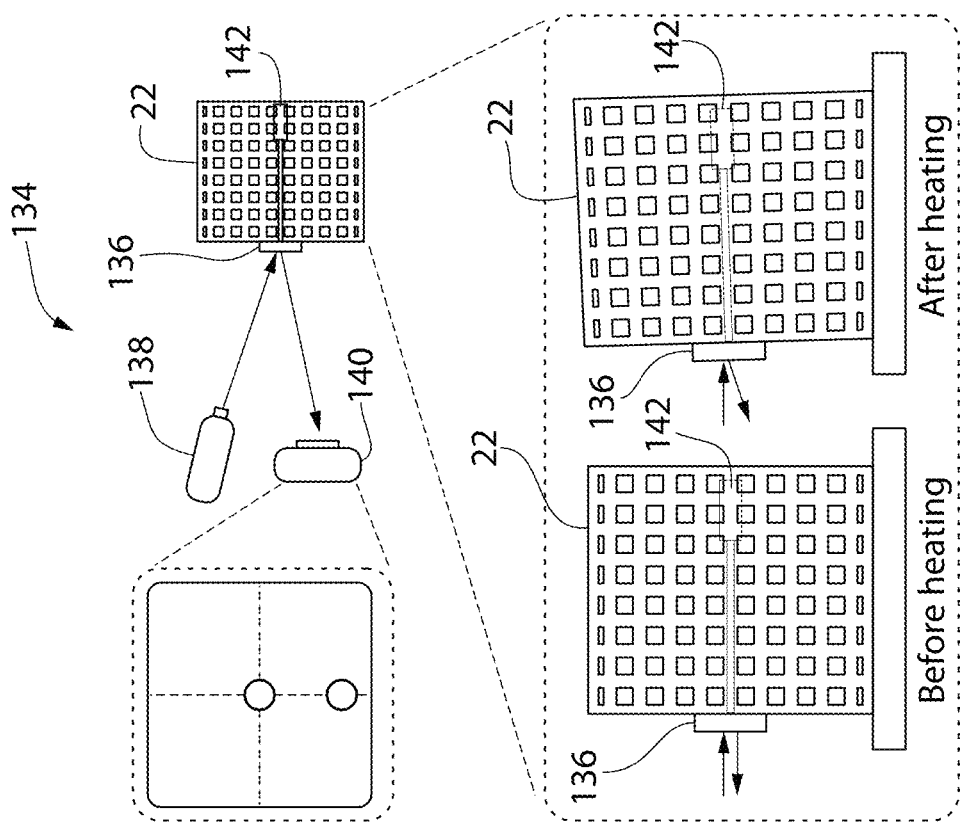

FIG. 17A shows an experimental set up 134 to study the thermal deformation of passive air cooling mount 22 and passive air cooling mount 22' and their impacts to the distortion of the optical cavity. A mirror 136 was attached at the output end of passive air cooling mount 22 and passive air cooling mount 22' as shown in FIG. 17A to reflect a collimated 532-nm diode laser beam from a laser 138 to a CCD camera 140 mounted 2 m away from mirror 136. By monitoring the movement of the laser spot on CCD camera 140 as shown, the thermal-induced change of the mirror reflection angle can be measured. FIG. 17B shows the reflection angle changes of mirror 136 as a function of time when electrical heater 142 was turned on for both the uniform and non-uniform structures. The non-uniform structure showed significantly less thermal-induced reflection angle change. At t=400 seconds, when the temperature profiles shown in FIGS. 16C and 16G were measured, the passive air cooling mount 22' yielded 41% less mirror reflection angle changes than that of passive air cooling mount 22. This is shown in FIG. 17B. This is consistent with the 39% reduction of temperature gradients discussed above. In addition, it can be observed that the deformation ratio of the non-uniform structure is larger than the uniform design before steady-state. This implies that the non-uniform structure can rapidly reach the steady state and ensure the stability of the laser alignment. The reason is that the optimization tends to distribute more material in the opposite direction of the heat source, and thus leads to a weaker heat transfer in the transient process.

The laser designs and construction materials described herein can be achieved digitally using computer-aided design and simulation software. Thus, diverse and distinct scientific needs for a special laser design can be met without incurring additional manufacturing costs. This disclosed concept demonstrates that using cellular structures as building blocks, a highly stable and lightweight laser system can be manufactured, and, as discussed above, the thermo-mechanical properties of the laser structures can be fine-tuned to improve optical performance.

Furthermore, compared to crystal rod 12, pump laser 8 is more sensitive to temperature increases and therefore requires more cooling power. Thus, according to an aspect of the disclosed concept, active water cooling mount 26 is used to cool pump laser 8.

Figure 18:
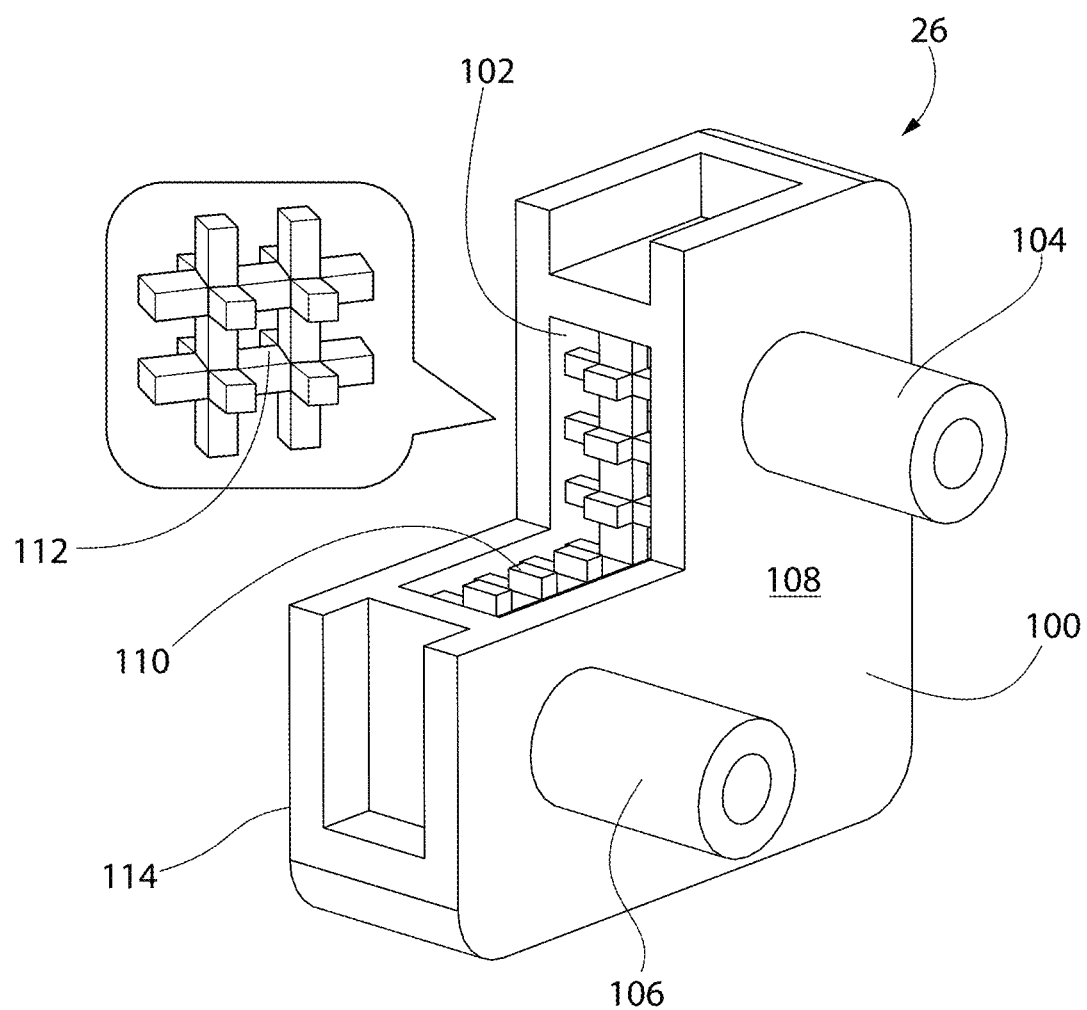
FIG. 18 is an isometric view of an active water cooling mount according to the exemplary embodiment of the disclosed concept.

FIG. 18 is an isometric view of active water cooling mount 26 according to the exemplary embodiment of the disclosed concept. Active water cooling mount 26 includes a housing 100 having a hollow chamber 102 formed therein. An input port 104 and an output port 106 are provided on a first surface 108 of housing 100. Input port 104 and output port 106 are fluidly coupled to chamber 102 so as to enable cooling water (or another liquid) to be provided to and extracted from active water cooling mount 26. In addition, a cellular structure 110 made up of a plurality of unit cells 112 is provided within chamber 102. In the illustrated embodiment, pump laser 8 is directly coupled to a second surface 114 of housing 100 opposite first surface 108 so that it may be actively cooled by active water cooling mount 26. Thermal grease may also be used to coupled pump laser 8 to second surface 114 to increase thermal conductivity. Provision of cellular structure 110 can double the heat exchange surface area, thus increasing the cooling efficiency of active water cooling mount 26. In the exemplary embodiment, active water cooling mount 26 is able to provide sufficient cooling power to maintain a low temperature for pump laser 8 to ensure maximum output power, a long lifetime, and low wavelength drift.

Figure 19:
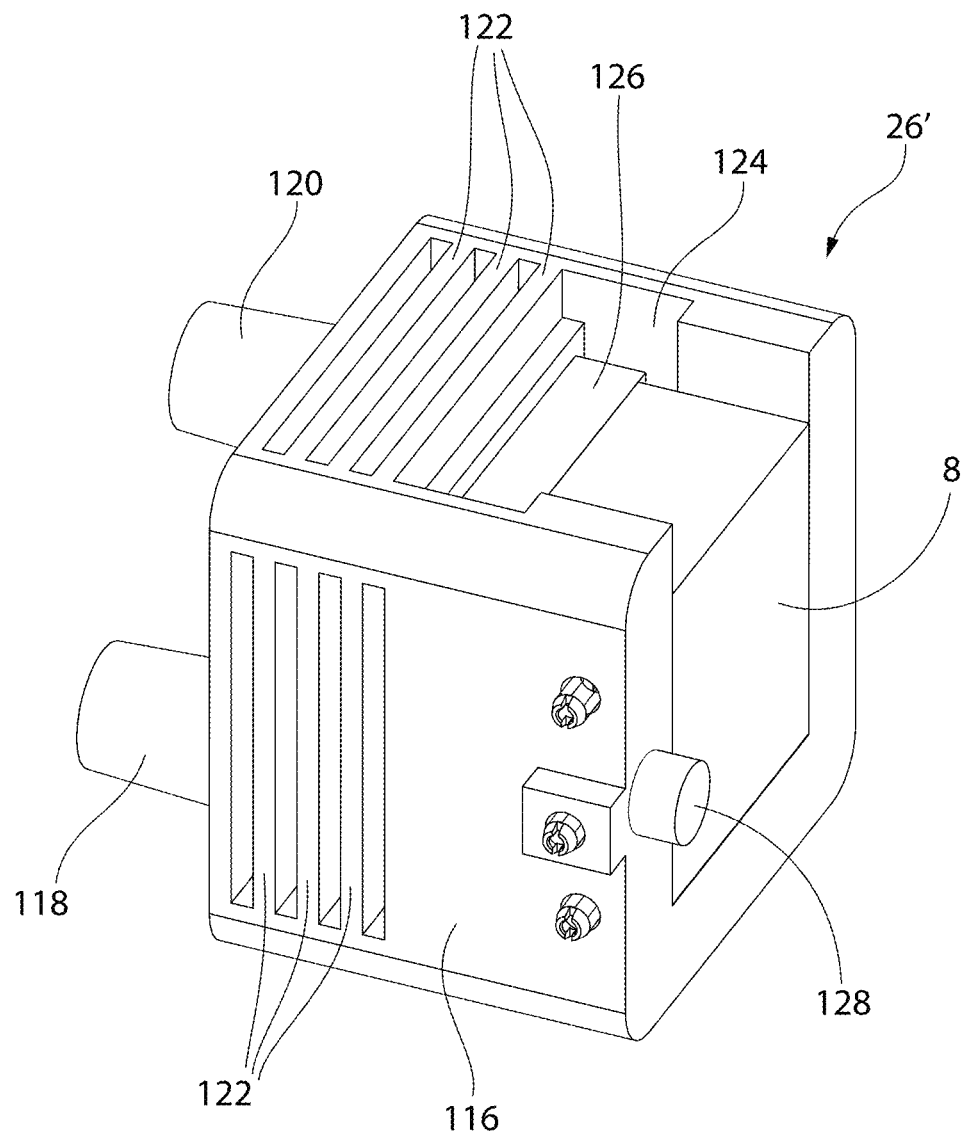
FIG. 19 is an isometric view of an alternative active cooling mount according to an alternative exemplary embodiment of the disclosed concept.

FIG. 19 is an isometric view of an alternative active cooling mount, labeled 26', which may be used in place of active water cooling mount 26. Active water cooling mount 26' includes a housing 116 having a hollow internal chamber, and an input port 118 and an output port 120 that are fluidly coupled to the internal chamber so as to enable cooling water (or another liquid) to be provided to and extracted from active water cooling mount 26'. Like active water cooling mount 26, a cellular structure similar to cellular structure 110 is provided within the internal chamber. In the illustrated embodiment, a plurality of cooling fins 122 are provided on an exterior surface of housing 116. Furthermore, housing 116 includes a slot like recess 124 that is structured to receive and hold therein pump laser 8 (held in place by screws as shown) and a Peltier cell 126. In addition, in the illustrated embodiment, a temperature sensor 128 is mounted to housing 116 by a screw as shown and is structured to be operatively coupled to a control system for laser system 2 to enable the temperature of active water cooling mount 26' to be monitored.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A laser frame for holding a plurality of optical components, composing:
 a first flexure structure for adjustably holding a first one of the optical components;
 a first cellular structure for supporting and cooling a second one of the optical components, wherein the first flexure structure and the first cellular structure are a unitary structure, the unitary structure being formed by additive manufacturing;
 a second flexure structure for adjustably holding a third one of the optical components; and
 a second cellular structure for holding and cooling a fourth one of the optical components, wherein at least the first flexure structure, the first cellular structure and the second cellular structure are part of the unitary structure, wherein the first one of the optical components is an output coupler, the second one of the optical components is a crystal rod, the third one of the optical components is a focusing lens, and the fourth one of the optical components is a pump laser, wherein the first cellular structure is a passive cooling structure and includes a central bore for receiving and holding the second one of the optical components, wherein the first cellular structure has a non-uniform density, and wherein the passive cooling structure has a front end and a back end opposite the front end, wherein the passive cooling structure comprises a plurality of unit cells each having a density, and wherein the passive cooling structure has a density profile from the back end to the front end based on the densities of the units cells, and wherein the density profile increases from the back end to the front end.

2. The laser frame according to claim 1, wherein the density of each of the unit cells is locally optimized based on convection and conduction heat transfer to determine the density profile in order to minimize a temperature gradient along an axis from the back end to the front end when the passive cooling structure is heated.

3. A laser frame for holding a plurality of optical components, composing:
 a first flexure structure for adjustably holding a first one of the optical components;
 a first cellular structure for supporting and cooling a second one of the optical components, wherein the first flexure structure and the first cellular structure are a unitary structure, the unitary structure being formed by additive manufacturing;
 a second flexure structure for adjustably holding a third one of the optical components; and
 a second cellular structure for holding and cooling a fourth one of the optical components, wherein at least the first flexure structure, the first cellular structure and the second cellular structure are part of the unitary structure, wherein the first one of the optical components is an output coupler, the second one of the optical components is a crystal rod, the third one of the optical components is a focusing lens, and the fourth one of the optical components is a pump laser, wherein the first cellular structure is a passive cooling structure and includes a central bore for receiving and holding the second one of the optical components, wherein the first cellular structure has a non-uniform density, and wherein the first cellular structure has a first end and a second end opposite the first end, wherein the first end is positioned closer to the second cellular structure than the second end, wherein the first end has a first density and the second and has a second density, and wherein the first density is lower than the second density.

4. A laser frame for holding a plurality of optical components, composing:
 a first flexure structure for adjustably holding a first one of the optical components;
 a first cellular structure for supporting and cooling a second one of the optical components, wherein the first flexure structure and the first cellular structure are a unitary structure, the unitary structure being formed by additive manufacturing;
 a second flexure structure for adjustably holding a third one of the optical components; and
 a second cellular structure for holding and cooling a fourth one of the optical components, wherein at least the first flexure structure, the first cellular structure and the second cellular structure are part of the unitary structure, wherein the first one of the optical components is an output coupler, the second one of the optical components is a crystal rod, the third one of the optical components is a focusing lens, and the fourth one of the optical components is a pump laser, and wherein the second cellular structure is an active cooling structure structured to receive a cooling liquid.

5. The laser frame according to claim 4, wherein the second cellular structure includes a housing having an internal chamber and an internal cellular structure provided in the internal chamber.

6. The laser frame according to claim 5, wherein the second cellular structure includes a recess adjacent the housing that is structured to receive and hold the fourth optical component.

7. The laser frame according to claim 5, wherein the second cellular structure further comprises a plurality of cooling fins provided on an exterior of the housing.

8. The laser frame according to claim 5, wherein the second cellular structure further comprises a liquid input port and a liquid output port.

9. A laser frame for holding an optical component, comprising:
 a passive cooling cellular structure for supporting and cooling the optical component, wherein the passive cooling cellular structure has a non-uniform density, wherein the passive cooling cellular structure has a front end and a back end opposite the front end, wherein the passive cooling cellular structure comprises a plurality of unit cells each having a density, wherein the passive cooling cellular structure has a density profile from the back end to the front end based on the densities of the units cells, and wherein the density profile increases from the back end to the front end, and wherein the laser frame is a unitary structure formed by additive manufacturing.

10. The laser frame according to claim 9, wherein the optical component is a crystal rod, wherein the passive cooling cellular structure includes a central bore for receiving and holding the crystal rod.

11. The laser frame according to claim 9, wherein the density of each of the unit cells is locally optimized based on convection and conduction heat transfer to determine the density profile in order to minimize a temperature gradient along an axis from the back end to the front end when the laser frame is heated.

12. A laser system including a laser cavity supported by the laser frame of claim 9, the laser cavity comprising the optical component.

13. A laser frame for holding an optical component, comprising:
   a passive cooling cellular structure for supporting and cooling the optical component, wherein the passive cooling cellular structure has a non-uniform density, wherein the passive cooling cellular structure has a first end and a second end opposite the first end, wherein the first end has a first density and the second and has a second density, and wherein the first density is lower than the second density, and wherein the laser frame is a unitary structure formed by additive manufacturing.

14. The laser frame according to claim 13, wherein the passive cooling cellular structure comprises hollow sphere unit cells.

15. The laser frame according to claim 13, wherein the passive cooling cellular structure comprises cubic lattice unit cells.

* * * * *

UNITED STATES PATENT AND TRADEMARK OFFICE
CERTIFICATE OF CORRECTION

PATENT NO. : 10,811,835 B2
APPLICATION NO. : 15/897490
DATED : October 20, 2020
INVENTOR(S) : Peng Kevin Chen, Shuo Li and Albert Chi Fu To Page 1 of 1

It is certified that error appears in the above-identified patent and that said Letters Patent is hereby corrected as shown below:

In the Specification

In Column 1, Line 15, remove the paragraph under GOVERNMENT CONTRACT, and add the following paragraph:
This invention was made with government support under grant # HDTRA1-12-1-0019 awarded by the Defense Threat Reduction Agency (DTRA) and under grant # DE-NE0008303 awarded by the Department of Energy. The government has certain rights in the invention.

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*